United States Patent
Yamazaki

(10) Patent No.: US 7,564,059 B2
(45) Date of Patent: Jul. 21, 2009

(54) SEMICONDUCTOR DEVICE WITH TAPERED GATES

(75) Inventor: Shunpei Yamazaki, Tokyo (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 9 days.

(21) Appl. No.: 11/234,382

(22) Filed: Sep. 26, 2005

(65) Prior Publication Data

US 2006/0091387 A1    May 4, 2006

Related U.S. Application Data

(62) Division of application No. 10/079,512, filed on Feb. 22, 2002, now Pat. No. 6,949,767, which is a division of application No. 09/440,633, filed on Nov. 16, 1999, now Pat. No. 6,365,917.

(30) Foreign Application Priority Data

Nov. 25, 1998  (JP) ............................... 10-333665

(51) Int. Cl.
*H01L 27/146*    (2006.01)

(52) U.S. Cl. .................. 257/72; 257/59; 257/350; 257/351; 257/E29.117; 257/E29.137; 257/E29.151; 257/E29.273; 349/42; 349/43; 349/46

(58) Field of Classification Search .............. 257/59, 257/72, 346, E27.131, E29.117, E29.122, 257/E29.151, 347, 350, 351, E27.132, E29.273, 257/E29.137; 349/42, 43, 46

See application file for complete search history.

(56) References Cited

U.S. PATENT DOCUMENTS 3,933,529 A    1/1976   Goser (Continued)

FOREIGN PATENT DOCUMENTS

EP    0 588 370    3/1994

(Continued)

OTHER PUBLICATIONS

Furue et al., "Characteristics and Driving Scheme of Polymer-Stabilized Monostable FLCD Exhibiting Fast Response Time and High Contrast Ratio with Gray-Scale Capability", SID 98 Digest, pp. 782-785.

(Continued)

*Primary Examiner*—Ngan Ngo
*Assistant Examiner*—Benjamin Tzu-Hung Liu
(74) *Attorney, Agent, or Firm*—Nixon Peabody LLP; Jeffrey L. Costellia

(57) ABSTRACT

In order to realize a higher reliability TFT and a high reliability semiconductor device, an NTFT of the present invention has a channel forming region, n-type first, second, and third impurity regions in a semiconductor layer. The second impurity region is a low concentration impurity region that overlaps a tapered potion of a gate electrode with a gate insulating film interposed therebetween, and the impurity concentration of the second impurity region increases gradually from the channel forming region to the first impurity region. And, the third impurity region is a low concentration impurity region that does not overlap the gate electrode.

Moreover, a plurality of NTFTs on the same substrate should have different second impurity region lengths, respectively, according to difference of the operating voltages. That is, when the operating voltage of the second TFT is higher than the operating voltage of the first TFT, the length of the second impurity region is longer on the second TFT than on the first TFT.

13 Claims, 21 Drawing Sheets

U.S. PATENT DOCUMENTS

| | | | |
|---|---|---|---|
| 4,394,182 A * | 7/1983 | Maddox, III | 438/163 |
| 4,851,363 A * | 7/1989 | Troxell et al. | 438/151 |
| 4,942,441 A | 7/1990 | Konishi et al. | |
| 4,963,504 A | 10/1990 | Huang | |
| 5,015,599 A | 5/1991 | Verhaar | |
| 5,100,820 A | 3/1992 | Tsubone | |
| 5,177,571 A | 1/1993 | Satoh et al. | |
| 5,182,619 A | 1/1993 | Pfiester | |
| 5,187,602 A | 2/1993 | Ikeda et al. | |
| 5,217,910 A | 6/1993 | Shimizu et al. | |
| 5,247,190 A | 9/1993 | Friend et al. | |
| 5,254,490 A | 10/1993 | Kondo | |
| 5,276,347 A | 1/1994 | Wei et al. | |
| 5,281,840 A | 1/1994 | Sarma | |
| 5,323,042 A | 6/1994 | Matsumoto | |
| 5,358,879 A | 10/1994 | Brady et al. | |
| 5,399,502 A | 3/1995 | Friend et al. | |
| 5,401,982 A | 3/1995 | King et al. | |
| 5,412,240 A | 5/1995 | Inoue et al. | |
| 5,413,945 A | 5/1995 | Chien et al. | |
| 5,482,871 A | 1/1996 | Pollack | |
| 5,508,209 A | 4/1996 | Zhang et al. | |
| 5,528,397 A | 6/1996 | Zavracky et al. | |
| 5,532,175 A | 7/1996 | Racanelli et al. | |
| 5,532,176 A | 7/1996 | Katada et al. | |
| 5,543,340 A | 8/1996 | Lee | |
| 5,543,947 A | 8/1996 | Mase et al. | |
| 5,567,966 A | 10/1996 | Hwang | |
| 5,572,046 A * | 11/1996 | Takemura | 257/66 |
| 5,581,092 A | 12/1996 | Takemura | |
| 5,583,369 A | 12/1996 | Yamazaki et al. | |
| 5,594,569 A | 1/1997 | Konuma et al. | |
| 5,616,506 A | 4/1997 | Takemura | |
| 5,623,157 A | 4/1997 | Miyazaki et al. | |
| 5,643,826 A | 7/1997 | Ohtani et al. | |
| 5,670,062 A | 9/1997 | Lin et al. | |
| 5,686,328 A | 11/1997 | Zhang et al. | |
| 5,693,959 A | 12/1997 | Inoue et al. | |
| 5,705,424 A | 1/1998 | Zavracky et al. | |
| 5,719,588 A | 2/1998 | Johnson | |
| 5,736,750 A | 4/1998 | Yamazaki et al. | |
| 5,742,363 A | 4/1998 | Bae | |
| 5,764,206 A | 6/1998 | Koyama et al. | |
| 5,767,930 A | 6/1998 | Kobayashi et al. | |
| 5,773,330 A | 6/1998 | Park | |
| 5,830,787 A * | 11/1998 | Kim | 438/163 |
| 5,841,170 A | 11/1998 | Adan et al. | |
| 5,852,481 A | 12/1998 | Hwang | |
| 5,858,820 A | 1/1999 | Jung et al. | |
| 5,903,249 A | 5/1999 | Koyama et al. | |
| 5,912,492 A | 6/1999 | Chang et al. | |
| 5,923,961 A | 7/1999 | Shibuya et al. | |
| 5,923,962 A | 7/1999 | Ohtani et al. | |
| 5,949,107 A | 9/1999 | Zhang | |
| 5,962,872 A | 10/1999 | Zhang et al. | |
| 5,965,919 A | 10/1999 | Yoo | |
| 5,981,367 A | 11/1999 | Gonzalez | |
| 6,001,714 A | 12/1999 | Nakajima et al. | |
| 6,008,100 A * | 12/1999 | Yeh et al. | 438/305 |
| 6,008,869 A | 12/1999 | Oana et al. | |
| 6,030,667 A | 2/2000 | Nakagawa et al. | |
| 6,049,092 A | 4/2000 | Konuma et al. | |
| 6,081,308 A | 6/2000 | Jeong et al. | |
| 6,087,679 A | 7/2000 | Yamazaki et al. | |
| 6,114,715 A | 9/2000 | Hamada | |
| 6,133,074 A | 10/2000 | Ishida et al. | |
| 6,140,667 A | 10/2000 | Yamazaki et al. | |
| 6,160,279 A | 12/2000 | Zhang et al. | |
| 6,165,824 A | 12/2000 | Takano et al. | |
| 6,166,396 A | 12/2000 | Yamazaki | |
| 6,166,414 A | 12/2000 | Miyazaki et al. | |
| 6,180,957 B1 | 1/2001 | Miyasaka et al. | |
| 6,198,132 B1 * | 3/2001 | Ishida et al. | 257/347 |
| 6,198,133 B1 | 3/2001 | Yamazaki et al. | |
| 6,222,238 B1 | 4/2001 | Chang et al. | |
| 6,259,120 B1 | 7/2001 | Zhang et al. | |
| 6,259,138 B1 | 7/2001 | Ohtani et al. | |
| 6,259,144 B1 | 7/2001 | Gonzalez | |
| 6,274,887 B1 | 8/2001 | Yamazaki et al. | |
| 6,281,552 B1 | 8/2001 | Kawasaki et al. | |
| 6,285,042 B1 | 9/2001 | Ohtani et al. | |
| 6,307,214 B1 | 10/2001 | Ohtani et al. | |
| 6,335,290 B1 | 1/2002 | Ishida | |
| 6,335,541 B1 | 1/2002 | Ohtani et al. | |
| 6,348,368 B1 | 2/2002 | Yamazaki et al. | |
| 6,365,933 B1 | 4/2002 | Yamazaki et al. | |
| 6,469,317 B1 | 10/2002 | Yamazaki et al. | |
| 6,479,333 B1 | 11/2002 | Takano et al. | |
| 6,501,098 B2 | 12/2002 | Yamazaki | |
| 6,507,069 B1 | 1/2003 | Zhang et al. | |
| 6,515,338 B1 | 2/2003 | Inumiya et al. | |
| 6,534,789 B2 | 3/2003 | Ishida | |
| 6,541,294 B1 | 4/2003 | Yamazaki et al. | |
| 6,590,230 B1 | 7/2003 | Yamazaki et al. | |
| 6,617,644 B1 | 9/2003 | Yamazaki et al. | |
| 6,646,287 B1 | 11/2003 | Ono et al. | |
| 6,664,145 B1 | 12/2003 | Yamazaki et al. | |
| 6,773,971 B1 | 8/2004 | Zhang et al. | |
| 6,867,431 B2 | 3/2005 | Konuma et al. | |
| 6,891,195 B2 | 5/2005 | Yamazaki et al. | |
| 2002/0134983 A1 | 9/2002 | Yamazaki | |
| 2002/0163049 A1 | 11/2002 | Yamazaki et al. | |
| 2003/0054653 A1 | 3/2003 | Yamazaki et al. | |
| 2003/0122132 A1 | 7/2003 | Yamazaki | |
| 2003/0138985 A1 | 7/2003 | Rhodes | |
| 2004/0051142 A1 | 3/2004 | Yamazaki et al. | |
| 2006/0051906 A1 | 3/2006 | Yamazaki | |

FOREIGN PATENT DOCUMENTS

| | | |
|---|---|---|
| EP | 0 589 478 | 3/1994 |
| EP | 0 738 012 | 10/1996 |
| EP | 10-294280 | 4/1998 |
| JP | 60-127761 | 7/1985 |
| JP | 04-258160 | 9/1992 |
| JP | 04-369271 | 12/1992 |
| JP | 05-102483 | 4/1993 |
| JP | 06-148685 | 5/1994 |
| JP | 07-130652 | 5/1995 |
| JP | 07-235680 | 9/1995 |
| JP | 08-078329 | 3/1996 |
| JP | 08-264784 | 10/1996 |
| JP | 08-274336 | 10/1996 |
| JP | 09-191111 | 7/1997 |
| JP | 09-293600 | 11/1997 |
| JP | 10-0065181 A | 3/1998 |
| JP | 10-92576 | 4/1998 |
| JP | 10-104659 | 4/1998 |
| JP | 10-135468 | 5/1998 |
| JP | 10-135469 | 5/1998 |
| JP | 10-233511 | 9/1998 |
| JP | 10-294280 | 11/1998 |
| JP | 11-191628 | 7/1999 |
| JP | 11-345767 | 12/1999 |
| JP | 11-354442 | 12/1999 |
| JP | 2000-047263 | 2/2000 |
| WO | WO 90/13148 | 1/1990 |
| WO | WO 90/13148 | 11/1990 |

OTHER PUBLICATIONS

T. Yoshida et al., "A Full-Color Thresholdless Antiferroelectric LCD Exhibiting Wide Viewing Angle with Fast Response Time", SID 97 Digest, pp. 841-844.

Inui et al., "Thresholdless Antiferroelectricity in Liquid Crystals and Its Application to Displays", J. Mater. Chem., 1996, 6(4), pp. 671-673.

Terada et al., "Half-V Switching Mode FLCD", Proceedings of the 46th Applied Physics Association Lectures, 28P-V-8, p. 1316, Mar. 1999.

T. Yoshihara et al., "Time Division Full Color LCD by Ferroelectric Liquid Crystal", Ekisho, vol. 3, No. 3, pp. 190-194, 1999.

Hermann Schenk et al., "Polymers for Light Emitting Diodes", EuroDisplay The 19$^{th}$ International Display Research Conference, Sep. 6-9, 1999 Proceedings, pp. 33-37.

U.S. Appl. No. 09/433,705; filed Nov. 4, 1999; Shunpei Yamazaki; "Method of Fabricating a Semiconductor Device" (Specification;. Claims, Abstract, Drawings, Official Filing Receipt and Official Action dated Mar. 12, 2004 with Partial English Translation of Japanese Patent No. 8-264784)); Status: Pending.

Hatano et al., "A Novel Self Aligned Gate-Overlapped LDD Poly-Si TFT With High Reliability and Performance", IEDM 1997, pp. 523-526.

Shimokawa et al., "Characterization of High-Efficiency Cast-Si Solar Cell Wafers by MBIC Measurement", Japanese Journal of Applied Physics, vol. 27, No. 5, May 1988, pp. 751-758.

* cited by examiner

FIG. 1A
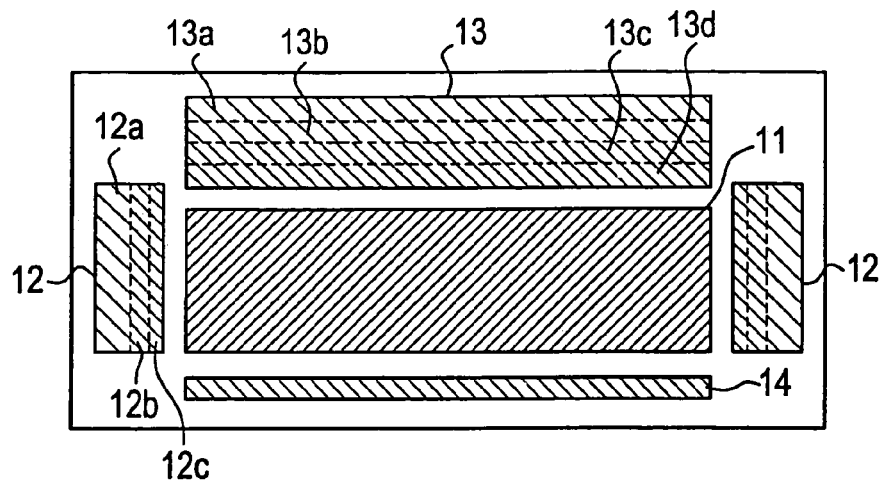
FIG. 1B
FIG. 1C
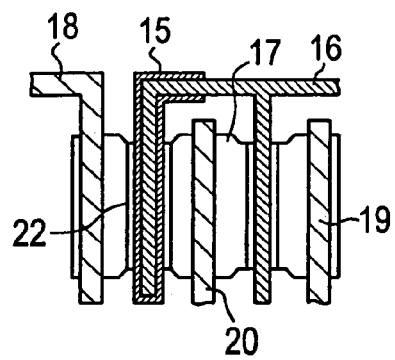
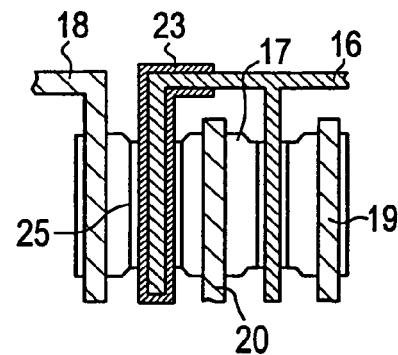
FIG. 1D
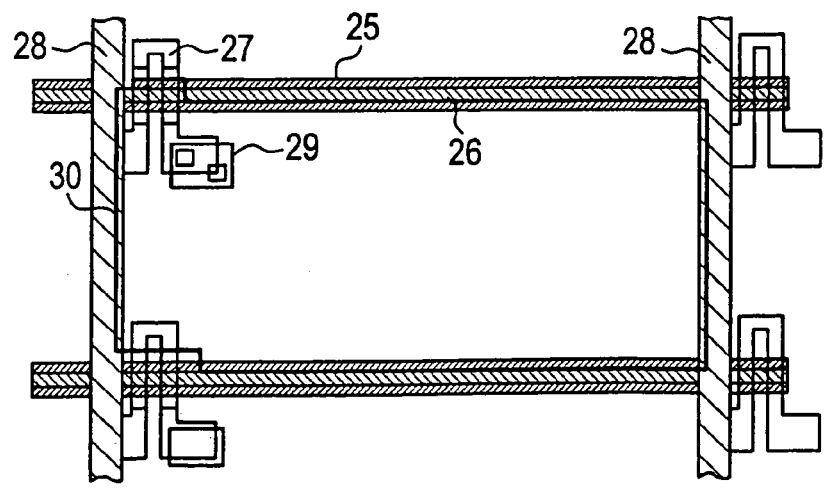

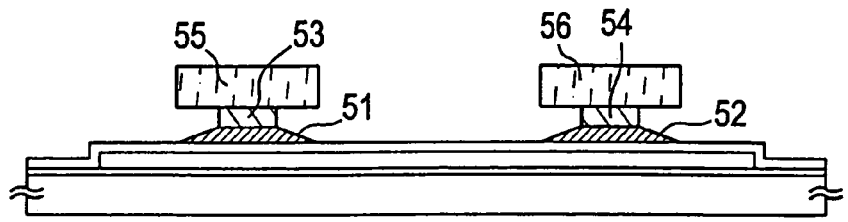
FIG. 10A
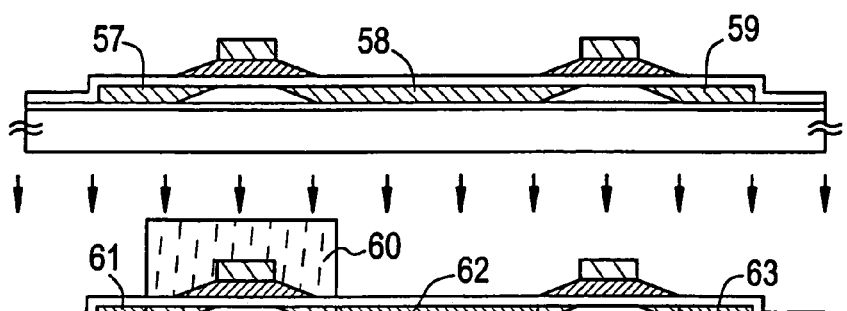
FIG. 10B
FIG. 10C
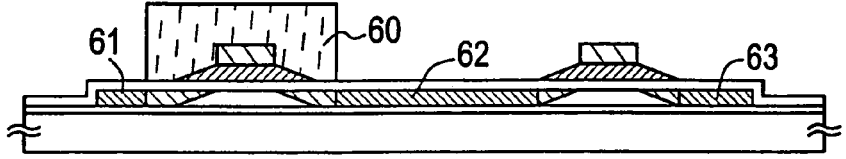
FIG. 10D
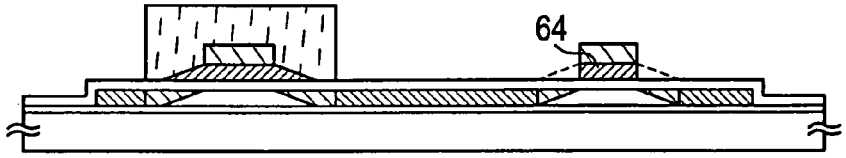
FIG. 10E
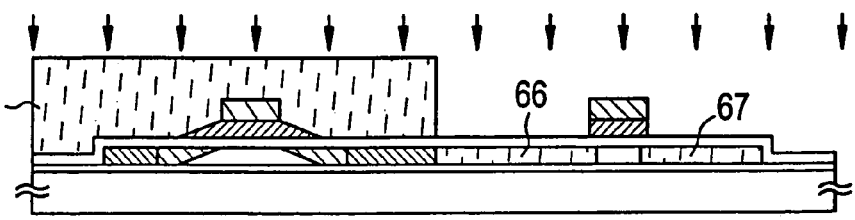
FIG. 10F
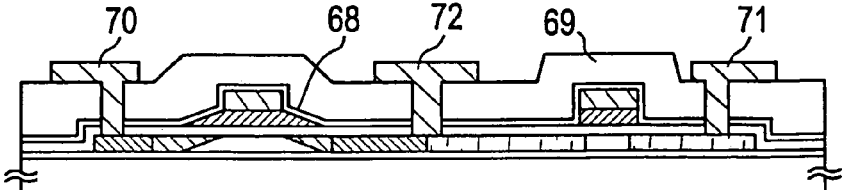

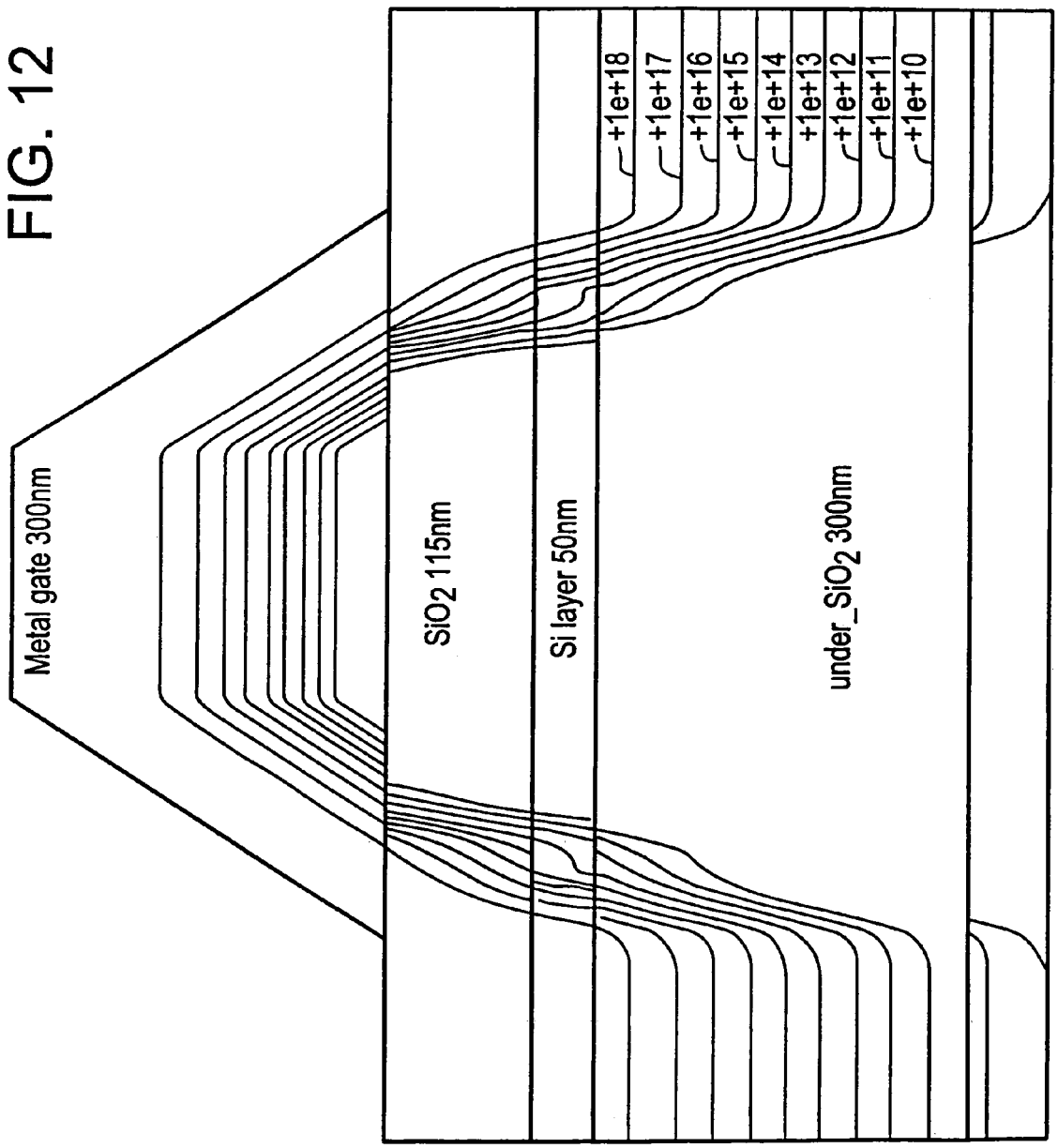

SEMICONDUCTOR DEVICE WITH TAPERED GATES

BACKGROUND OF THE INVENTION

1. Field of the Invention

The present invention relates to a thin film transistor (hereinafter referred to as TFT) and to a semiconductor device having a circuit structured with a thin film transistor. The present invention relates to such semiconductor devices as electro-optical devices, typically active matrix liquid crystal display devices (hereinafter referred to as AM-LCDs), and semiconductor circuits including processors, etc. The present invention also relates to electronic equipment loaded with the electro-optical devices or semiconductor circuits. Note that throughout this specification semiconductor device indicates general devices that acquire their function through the use of semiconductor characteristics, and that electro-optical devices, semiconductor circuits, and electronic equipment are semiconductor devices.

2. Description of the Related Art

Active matrix type liquid crystal display devices composed of TFT circuits that use polysilicon films have been in the spotlight in recent years. They are the backbone for realizing high definition image displays, in which a multiple number of pixels are arranged in a matrix state, and the electric fields that occur in liquid crystals are controlled in that matrix state.

With this type of active matrix type liquid crystal display device, as the resolution becomes high definition in XGA and SXGA, the number of pixels alone exceeds one million. A driver circuit that drives all of the pixels is therefore extremely complex, and furthermore is formed from a large number of TFTs.

The required specifications for actual liquid crystal display device (also called liquid crystal panels) are strict, and in order for all of the pixels to operate normally, high reliability must be secured for both the pixels and the driver circuit. If an abnormality occurs in the driver circuit, especially, this invites a fault called a line defect in which one column (or one row) of pixels turns off completely.

However, from a reliability point of view, TFTs that use polysilicon films still fall behind MOSFETs (transistors formed on a single crystal semiconductor substrate), etc., used in LSIs. As long as this shortcoming is not overcome, the point of view that it is difficult to use TFTs when forming an LSI circuit will get stronger.

The applicant of the present invention considers that when comparing a TFT with a MOSFET, the problems associated with the TFT structure affect its reliability (especially hot carrier resistance).

SUMMARY OF THE INVENTION

The present invention is technology for overcoming those problems, and therefore an object of the present invention is to realize a TFT that shows the same or higher reliability than a MOSFET. In addition, another object of the present invention is to realize a high reliability semiconductor device that includes semiconductor circuits formed by circuits using such TFT.

In order to solve the above problems, an n-channel TFT (hereinafter referred to as NTFT) of the present invention has: an n-type first impurity region that functions as a source region or drain region in a semiconductor layer where an inversion layer is formed; and two types of impurity regions (a second impurity region and a third impurity region), in between a channel forming region and the first impurity region, that show the same conductivity type as the first impurity region. The concentration of the impurity that determines the conductivity in the second and third impurity regions is less than that of the first impurity region. The second and third impurity regions function as high resistance regions, also called LDD regions.

The second impurity region is a low concentration impurity region that overlaps a gate electrode with a gate insulating film interposed therebetween, and has the effect of enhancing hot carrier resistance. On the other hand, the third impurity region is a low impurity region that does not overlap the gate electrode, and has the effect to prevent the off current from increasing.

The most important characteristic of the present invention, then, is that a first NTFT and a second NTFT exist on the same substrate, but have different second impurity region lengths, respectively. In other words, according to difference of the operating voltages, the appropriate TFTs having suitable second impurity region length should be arranged. Specifically, when the operating voltage of the second TFT is higher than the operating voltage of the first TFT, the length of the second impurity region is longer on the second TFT than on the first TFT.

Conventionally, it is known that hot carrier resistance increases with a so-called GOLD structure (gate-drain overlapped LDD). This technique has begun to be applied to TFTs, but the problem that with a conventional GOLD structure the off current increases (the current flow when the TFT is in an off state) has been unreasonably ignored.

The applicant of the present invention considers that the above problem must be resolved, and investigates to verify that the off current is reduced dramatically by forming an impurity region (the third impurity region) that does not overlap the gate electrode. Therefore it can be said that the present invention is characterized in the active formation of the third impurity region.

Note that the gate electrode is an electrode that intersects with the semiconductor layer with a gate insulating film interposed therebetween, and is an electrode for applying an electric field to the semiconductor layer and forming an inversion layer. The portion of a gate wiring that intersects with the semiconductor layer with a gate insulating film interposed therebetween is the gate electrode.

In addition, the film thickness of the gate electrode of the present invention decreases either linearly or stepwise from a central flat section, at the periphery of the gate electrode, outward. Namely, it is characterized by being patterned into a tapered shape.

The second impurity region is doped through (passing an impurity through) the tapered region of the gate electrode with the impurity to impart conductivity. Therefore the concentration gradient reflects the inclination (change in film thickness of the tapered portion) of the side face of the gate electrode. In other words, the concentration of the impurity doped into the second impurity region increases gradually from the channel forming region to the first impurity region.

This is caused by the change in the depth that the impurity reaches due to the difference in film thickness in the tapered region. In other words, when looking at the impurity concentration distribution in the depth direction, the depth at which the doped impurity is at peak concentration changes along with the inclination of the tapered portion of the gate electrode.

An impurity concentration gradient can be formed in the inside of the second impurity region with this type of structure. The present invention is characterized by actively forming this type of such a concentration gradient, forming a TFT structure that enhances the electric field relaxation effect.

Further, the structure of other gate electrodes in the present invention is a laminate of a first gate electrode, in contact with the gate insulating film, and a second gate electrode formed on the first gate electrode. Of course, a single layer first gate electrode may also be used.

In this structure, the side face (tapered portion) of the first gate electrode is has a tapered shape that forms with the gate insulating film an angle (shown by θ, and hereinafter referred to as taper angle) equal to or greater than 3° and equal to or less than 40° (desirable if equal to or greater than 5° and equal to or less than 35°, even better if equal to or greater than 8° and equal to or less than 20°). On the other hand, the width of the second gate electrode in the longitudinal direction of the channel is narrower than the first gate electrode.

Also for a thin film transistor having the above type of laminated gate electrode, the concentration distribution of the impurity included in the second impurity region reflects the change in film thickness in the tapered portion of the first gate electrode. The impurity concentration thereof increases gradually from the channel forming region in the direction of the first impurity region.

An NTFT with the above structure has high hot carrier resistance, and its voltage resistance characteristics (resistance to dielectric breakdown due to electric field concentration) are also good, so it is possible to prevent age-based deterioration in the on current (the current flow when the TFT is in an on state). This effect is due to the formation of the second impurity region.

In addition, it is possible to greatly reduce the off current by formation of the third impurity region. As outlined above, the formation of the third impurity region is a characteristic of the NTFT of the present invention.

The NTFT of the present invention has very high reliability. Thus it is possible to form a high reliability circuit when the NTFT is complementarily combined with a PTFT to form a CMOS circuit, or used in a pixel region (pixel matrix circuit) of a liquid crystal display device or an electroluminescence display device. In other words, compared with a conventional NTFT, the drop in capability of a circuit due to deterioration of the NTFT can be prevented.

Note that it is not especially necessary to use the above TFT structure for a p-channel type thin film transistor (hereinafter referred to as PTFT) in the present invention. Namely, a known structure may be used because a PTFT does not have as much of a deterioration problem as an NTFT. It is of course possible to use the same structure as the NTFT.

BRIEF DESCRIPTION OF THE DRAWINGS

In the accompanying drawings:

FIGS. 1A to 1D are diagrams for explaining the circuit arrangement of an AM-LCD;

FIGS. 10A to 10F are diagrams showing a manufacturing process of the CMOS circuit;

FIG. 12 is a diagram showing simulation results;

DETAILED DESCRIPTION OF THE PREFERRED EMBODIMENTS

Embodiment Mode 1

In Embodiment Mode 1, FIGS. 3A to 3D and FIGS. 4A to 4C are used to explain a manufacturing process of a TFT used in the present invention.

First, a base film 101 is formed over the entire surface of a substrate 100, and a semiconductor layer 102 with an island shape is formed on the base film 101. An insulating film 103 that becomes a gate insulating film is then formed over the entire surface area of the substrate 100, covering the semiconductor layer 102 (see FIG. 3A).

The following can be used as the substrate 100: a glass substrate; a quartz substrate; a crystalline glass substrate; a metallic substrate; a stainless steel substrate; and a resin substrate such as polyethylene terephthalate (PET).

The base film 101 is a film that prevents diffusion of mobile ions such as sodium ions, from the substrate 100 to the semiconductor layer 102, and increases adhesion of the semiconductor layer formed on the substrate 100. Either single layer or multiple layer inorganic insulating films such as a silicon oxide film, a silicon nitride film or an oxidized silicon nitride film can be used for the base film 101.

The base film need not only be a film deposited by CVD or sputtering. If a heat resistant substrate such as quartz is used, an amorphous silicon film, for example, may be deposited and then thermally oxidized, forming an oxidized silicon film.

The semiconductor layer 102 material may be chosen so that it conforms with the required characteristics of the TFT. An amorphous silicon film, an amorphous germanium film, or an amorphous silicon germanium film, or crystalline silicon, crystalline germanium or crystalline silicon germanium which are formed by crystallizing these amorphous semiconductor films with laser irradiation or annealing can be used. A known technique may be used as the means of crystallization. The thickness of the semiconductor layer 102 is between 10 and 150 nm (typically from 20 to 50 nm).

The insulating film 103 is a film that constitutes the gate insulating film. A single layer or multiple layer inorganic insulating film of silicon oxide, silicon nitride, or oxidized silicon nitride deposited by plasma CVD or sputtering can be used. In the case of a laminate film, a two layer film of oxidized silicon nitride and silicon oxide, or a laminate film of silicon nitride film sandwiched by silicon oxide films can be used, for example.

Figure 3A:
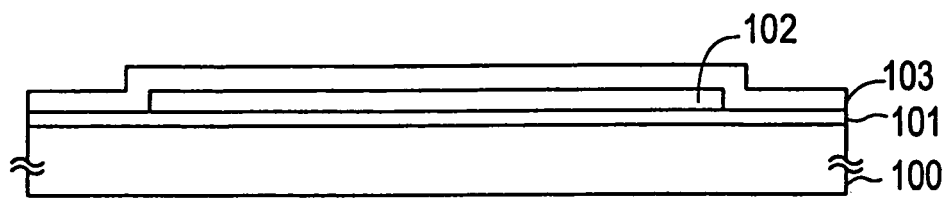
FIGS. 3A to 3D are diagrams showing a manufacturing process of an NTFT.
Figure 3B:
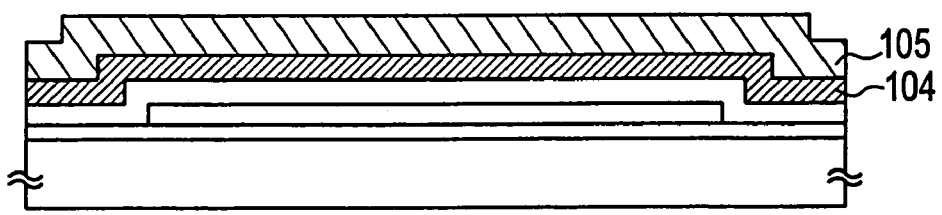
Figure 3C:
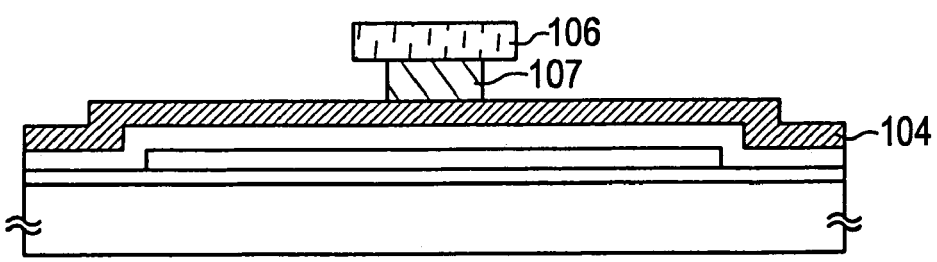
Figure 3D:
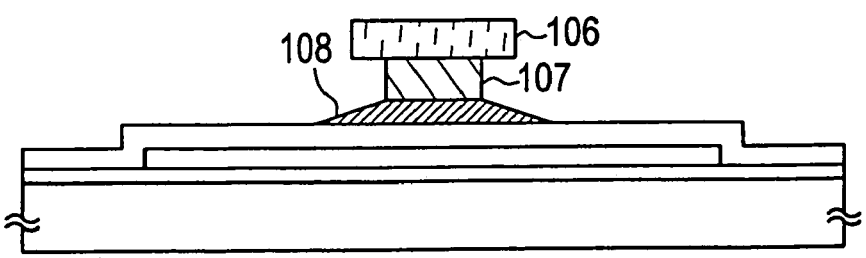

A first conductive film 104 and a second conductive film 105, which constitute a gate electrode (gate wiring) are formed on the insulating film 103 (see FIG. 3B).

The first conductive film 104 constitutes a first gate electrode (first gate wiring) having a tapered portion. Therefore a thin film of a material which can easily be taper etched is desirable. For example, a chromium (Cr) film, a tantalum (Ta) film, a thin film with tantalum as its main constituent (equal to or greater than 50% composition ratio), or an n-type silicon (Si) film containing phosphorous is typically used.

Further, the film thickness of the first conductive film 104 is an important parameter for the present invention because it determines the length (in the channel longitudinal direction) of the second impurity region (the impurity region overlapping the gate electrode). The length is selected in the range of 50 to 500 nm (desirable between 150 and 300 nm, even better between 200 and 250 nm) for the present invention.

In addition, the second conductive film 105 is a thin film that constitutes a second gate electrode (second gate wiring), and can be formed by a thin film of one of the following: an aluminum (Al) film; a copper (Cu) film; a thin film with either aluminum or copper as its main constituent (equal to or greater than 50% composition ratio); a chromium (Cr) film; a tantalum (Ta) film; a tantalum nitride (TaN) film; titanium (Ti) film; tungsten (W) film; molybdenum (Mo) film; an n-type silicon film containing phosphorous; a tungsten molybdenum (W—Mo) film; a tantalum molybdenum (Ta—Mo) film; etc. Further, not only can the above thin film be used as a single layer film, but a laminate with any combination of those may also be used.

However, it is necessary to choose a material for the first conductive film and the second conductive film in which a selective etching ratio can be obtained in mutual patterning.

For example, the following combinations can be selected as the first conductive film 104/the second conductive film 105 materials: n-type Si/Ta; n-type Si/W—Mo alloy; Ta/Al; Ti/Al; etc. As further guidelines for material selection, it is desirable that the second conductive film 105 have as low as possible resistivity, and should at least be from a material with a sheet resistance lower than that of the first conductive film 104. This is because the connection of the gate wiring and an upper layer wiring goes through the second gate wiring.

Next, a resist mask 106 is formed on the second conductive film 105. The second conductive film 105 is etched using the resist mask 106, forming a second gate electrode 107. Isotropic wet etching may be used for etching (see FIG. 3C).

Anisotropic etching of the first conductive film 104 is performed next using the same resist mask 106, forming a first gate electrode (first gate wiring) 108. Note that a new resist mask can be formed for use in this etching.

Figure 5:
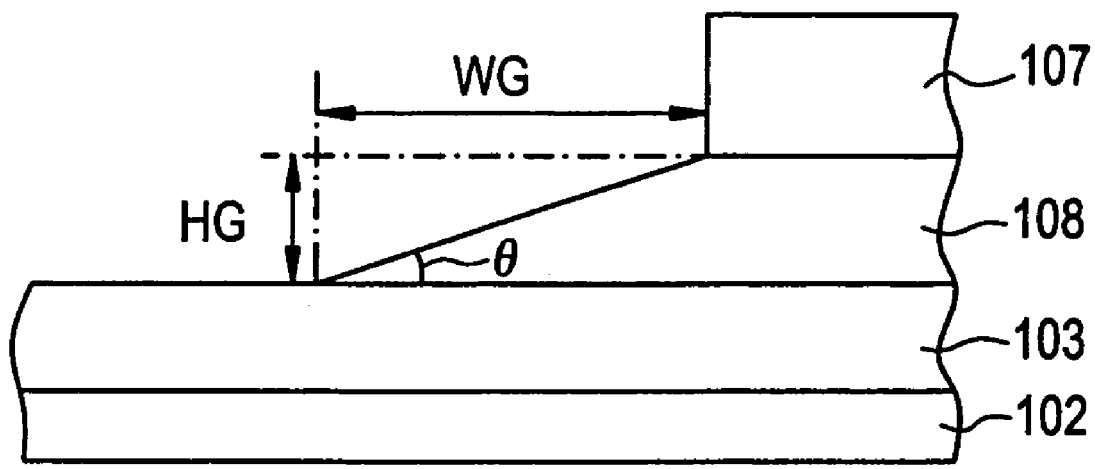
FIG. 5 is a diagram showing the cross sectional structure of an NTFT.

Through this etching, as shown in FIG. 5, the side face of the first gate electrode 108 forms a taper angle (θ), equal to or more than 3° and equal to or less than 40°, with the gate insulating film 103. It is desirable that the taper angle be equal to or more than 5° and equal to or less than 35°, even better if equal to or more than 7° and equal to or less than 20°. The change in film thickness in the tapered portion of the gate electrode 108 becomes smaller as the taper angle becomes small, and the change in the impurity concentration in the semiconductor layer that later overlaps the tapered portion correspondingly becomes more gentle.

Furthermore, if the taper angle exceeds 40°, then the length of the second impurity region (the region in which the impurity concentration changes gradually), the most important characteristic of the NTFT of the present invention, gets extremely short, so it is desirable that the taper angle is kept 40° or smaller.

The taper angle is defined as $\tan \theta = HG/WG$, where WG is the width of the tapered portion and HG is the thickness (the film thickness of the first gate electrode 108).

The resist mask 106 is removed next, and the second gate electrode 107 and the first gate electrode 108 are used as masks for doping an n-type or p-type impurity into the semiconductor layer 102. Ion implantation (mass separation type), and ion doping (non-mass separation type) can be used as the doping method.

An n-type impurity is an impurity that becomes a donor, and typically periodic table group XV (15) elements phosphorous (P) and arsenic (As) are used for silicon and germanium. A p-type impurity is an impurity that becomes an acceptor, and typically periodic table group VIII (13) elements boron (B) and gallium (Ga) are used for silicon and germanium.

Phosphorous is doped by ion doping here, forming $n^-$-type impurity regions 109 and 110. In this case phosphorous is doped through the gate insulating film 103 and the tapered portion of the first gate electrode 108, so it is necessary to set the acceleration voltage considerably high at between 80 and 160 keV for the ion doping process. Note that it is necessary to be careful because, as will be discussed later, the concentration and distribution of the phosphorous, which goes into the area underneath the tapered portion, changes in accordance with acceleration voltage.

This doping process determines the concentration distribution of phosphorous in an $n^-$-type second impurity region and an $n^-$-type third impurity region, discussed later (see FIG. 4A).

Specifically, phosphorous is doped into the $n^-$-type impurity regions 109 and 110 through (passing through) the tapered portion of the first gate electrode 108, so the concentration gradient reflects change in the film thickness of the tapered portion of the first gate electrode 108. In other words, the concentration of phosphorous doped into the $n^-$-type impurity regions 109 and 110 gradually increases with distance from the channel forming region underneath the tapered portion.

This is because the doping concentration of phosphorous in the depth direction changes due to the difference in film thickness in the tapered portion. Namely, when looking at the doping depth of an arbitrary concentration in the concentration distribution of phosphorous in the depth direction (for example, at an average concentration in the depth direction), the depth changes along with the inclination in the gate electrode tapered portion, in the cross sectional direction of the semiconductor layer.

The phosphorous concentration distribution is shown by wavy lines in FIG. 4A, but this does not mean that phosphorous is not doped below the wavy lines in the semiconductor layer. Rather, it schematically shows that the above stated change in phosphorous concentration in the cross sectional direction is formed along the inclination of the tapered portion of the first gate electrode 108.

Note that it is not necessary for the phosphorous doping process to be performed perpendicularly to the substrate at this time, and an ion containing phosphorous may be doped obliquely. This type of doping process is effective for cases in which phosphorous is doped deep into the inside of the gate electrode.

Next a resist mask 111 is formed, covering the first gate electrode 107 and the second gate electrode 108. The resist mask 111 determines the length of the third impurity region. The n-type impurity phosphorous is again doped into the semiconductor layer 102, through the resist mask 111, by ion doping. In this case there is no need to dope through the tapered portion of the first gate electrode 108, so the acceleration voltage may be set to around 80 to 100 keV (see FIG. 4B).

By this doping process, phosphorous is selectively doped into the n$^-$-type impurity regions 109 and 110 not covered by the resist mask 111, forming n$^+$-type first impurity regions 112 and 113. In addition, phosphorous is not doped into a region 114 underneath the second gate electrode 107 in the doping process of FIGS. 4A and 4B, and this becomes the channel forming region.

Furthermore, in the n$^-$-type impurity regions 109 and 110, into which phosphorous is not doped by the above process, regions denoted by reference numerals 115 and 116, which overlap the first gate electrode 108, become n$^-$-type second impurity regions. Regions that do not overlap the first gate electrode 108 become n$^-$-type third impurity regions 117 and 118.

Figure 4A:
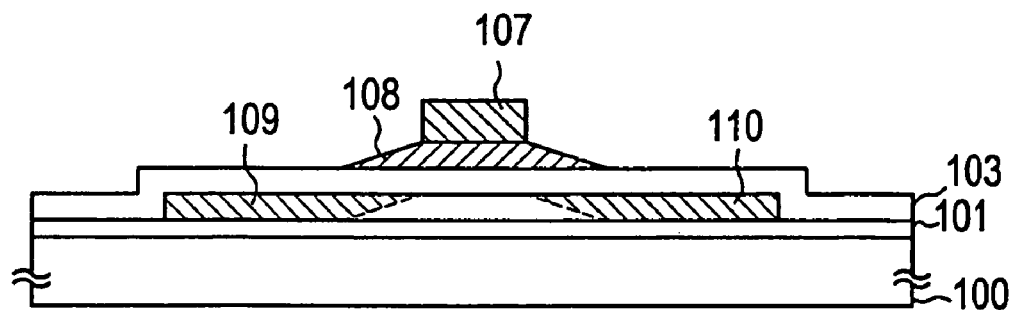
FIGS. 4A to 4C are diagrams showing the manufacturing process of an NTFT.
Figure 4B:
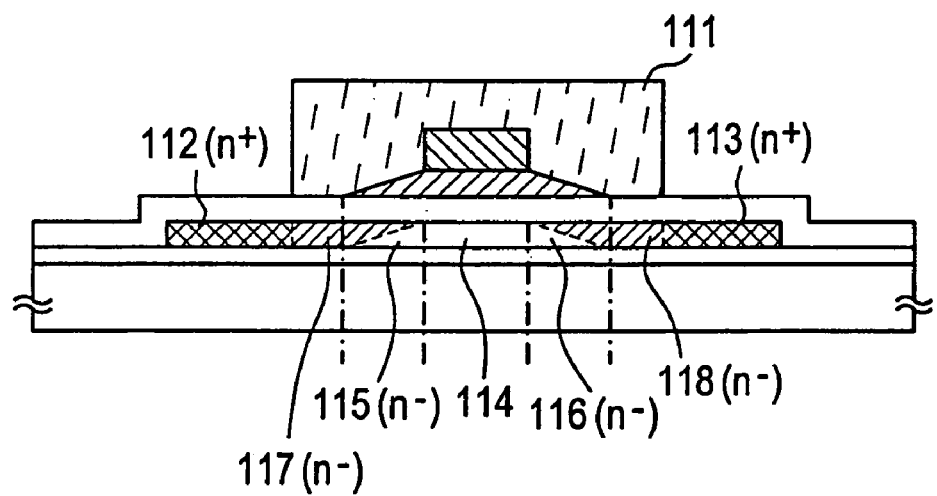

Note that the gate wiring may be used as a mask prior to the FIG. 4B doping process, and the insulating film 103 may be etched, exposing the surface of the semiconductor layer 102. In this case, it is not necessary to pass through the insulating film, and the acceleration voltage can be set low to about 10 keV. In other words, the system load can be alleviated. The throughput will also be improved because the impurity can be doped directly into the semiconductor layer.

At this point, as shown in FIGS. 6A to 6D, the phosphorous concentration distribution in the second impurity regions 115 and 116 can be separated into four types. In order to distinguish between these, the indices A, B, C, and D are attached in FIGS. 6A to 6D. Note that the second impurity regions 115 and 116 are formed to have left-right symmetry around the center of the gate electrode, so only the second impurity region 115 is focused upon and explained by FIGS. 6A to 6D.

Figure 6A:
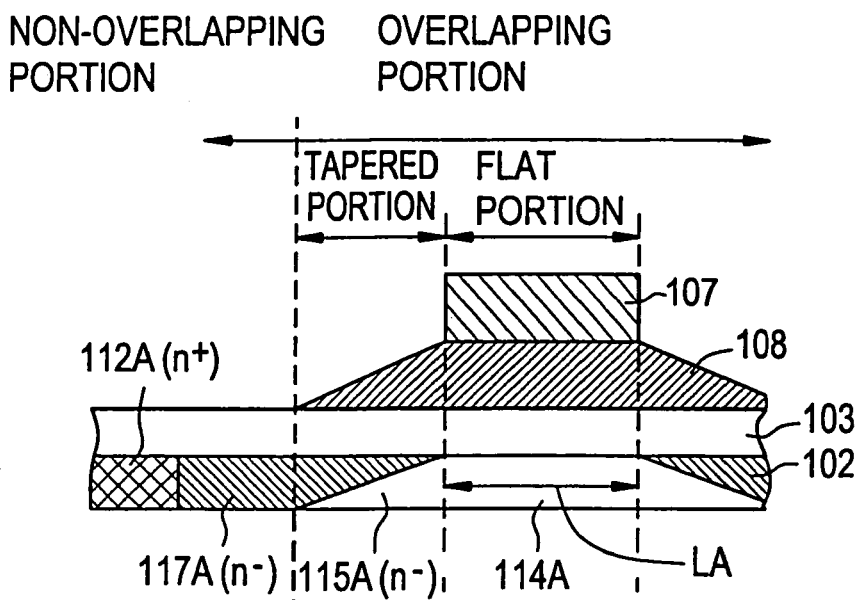
FIGS. 6A to 6D are diagrams showing the cross sectional structure of an NTFT.

As shown in FIG. 6A, the phosphurus concentration distribution in the second impurity region 115A corresponds to the change in film thickness in the tapered portion of the first gate electrode 108, and the peak concentration depth changes along with the inclination of the tapered portion. In addition, absolutely no phosphorous is doped into the channel forming region 114A in the case of FIG. 6A, and is almost uniformly doped throughout the third impurity region 117A film.

Furthermore, at this point the phosphorous concentration distribution inside the second impurity region 115A, as shown in the explanation of FIG. 4A, has a concentration distribution in the cross sectional direction that follows the tapered shape of the first gate electrode 108. In other words, for the case where the concentration of phosphorous doped into the semiconductor layer is averaged with respect to the depth direction, the phosphorous concentration gradually increases from the channel forming region 114A to the third impurity region 117A.

This is because a concentration gradient in the cross sectional direction inside the second impurity region 115A is formed due to phosphorous being doped through the tapered portion of the first gate electrode 108. In this case a channel length LA corresponds to the width of the second gate electrode 107 in the longitudinal direction of the channel.

Figure 6B:
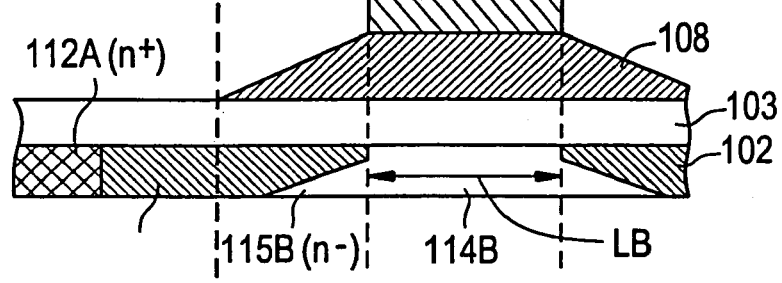

FIG. 6B shows an example where the acceleration voltage of the phosphorous doping process of FIG. 4A is set higher than in the case of FIG. 6A. In this case, the concentration of phosphorous in the connection portion of the second impurity region and the channel forming region (hereinafter called channel junction) is not almost zero (or, is the same as the phosphorous concentration in the channel forming region), as in FIG. 6A. The phosphorous is doped to a certain level also in the channel junction.

A channel length LB corresponds to the width of the second gate electrode 107 in the longitudinal direction of the channel for this case. In addition, even if the acceleration voltage is the same as in FIG. 6A, if the taper angle θ is smaller than that in FIG. 6A (when the film thickness of the tapered portion is thin), a phosphorous concentration distribution in the second impurity region like that in FIG. 6B can be obtained.

Figure 6C:
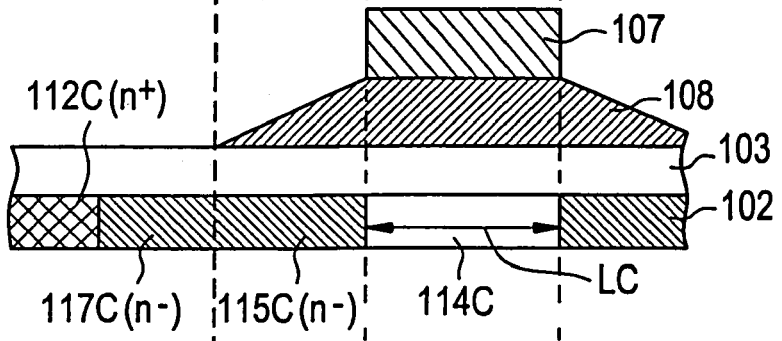

By making the acceleration voltage even larger, as shown in FIG. 6C, phosphorous is doped to a near uniform level throughout the entire semiconductor layer of the second impurity region 115C. A channel length LC corresponds to the width of the second gate electrode 107 in the longitudinal direction of the channel for this case.

Figure 6D:
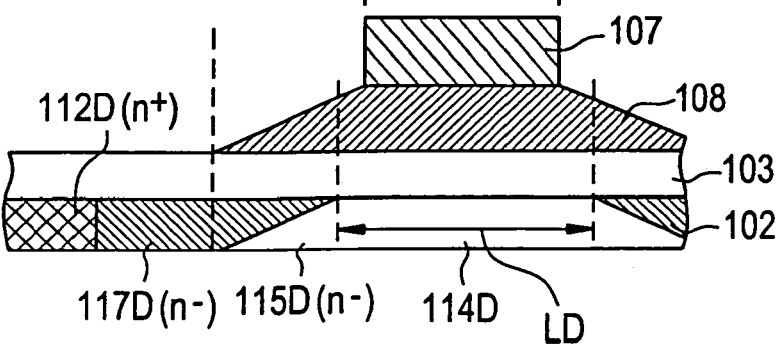

In addition, FIG. 6D shows an example of the case in which the acceleration voltage in the phosphorous doping process of FIG. 4A is set lower than in the case of FIG. 6A. As shown in FIG. 6D, in this case, a portion of the tapered portion of the first gate electrode 108 functions as a mask, so doping occurs selectively in the area where the film thickness of the tapered portion gets thin.

In other words, a region begins to form in which phosphorous is doped from the outside (the side close to the third impurity region) of the channel junction. The channel length does not coincide with the width of the second gate electrode 107 in the longitudinal direction of the channel, and instead becomes longer than that width.

Further, even if the acceleration voltage is the same as in FIG. 6A, if the taper angle θ is larger than that of FIG. 6A (when the film thickness of the tapered portion is thick), a phosphorous concentration distribution in the second impurity region like that in FIG. 6D can be obtained.

At this point the length of the first impurity regions 112 and 113 is between 2 and 20 μm (typically between 3 and 10 μm). Further, the phosphorous concentration in the semiconductor layer is between $1 \times 10^{19}$ and $1 \times 10^{21}$ atoms/cm$^3$ (typically between $1 \times 10^{20}$ and $5 \times 10^{20}$ atoms/cm$^3$). The first impurity regions 112 and 113 are low resistance regions and each of them electrically connects the source wiring or drain wiring to the TFT, and is a source region or a drain region.

In addition, the second impurity regions 115 and 116 have a length of between 0.1 and 3.5 μm (typically from 0.1 to 0.5 μm, desirable between 0.1 and 0.3 μm), and have a phosphorous concentration of $1 \times 10^{15}$ to $1 \times 10^{17}$ atoms/cm$^3$ (typically between $5 \times 10^{15}$ and $5 \times 10^{16}$ atoms/cm$^3$, desirable from $1 \times 10^{16}$ to $2 \times 10^{16}$ atoms/cm$^3$).

Further, the third impurity regions 117 and 118 have a length of between 0.5 and 3.5 μm (typically from 1.5 to 2.5 μm), and have a phosphorous concentration from $1 \times 10^{16}$ to $1 \times 10^{19}$ atoms/cm$^3$ (typically between $1 \times 10^{17}$ and $5 \times 10^{18}$ atoms/cm$^3$, desirable from $5 \times 10^{17}$ to $1 \times 10^{18}$ atoms/cm$^3$).

Additionally, the channel forming region 114 is an intrinsic semiconductor layer, or a region in which boron is doped to a concentration from $1 \times 10^{16}$ to $5 \times 10^{18}$ atoms/cm$^3$. Boron is used to control the threshold voltage and prevent punch-through, but another element may be substituted provided that similar effects are obtained.

Note that an example is shown in FIG. 4B in which low concentration impurity regions (the third impurity regions 117 and 118), which does not overlap the gate electrode, are formed between the first impurity regions 112 and 113 and the second impurity regions 115 and 116, respectively. However, each two or more impurity regions that have different impurity concentrations can be formed between the first impurity regions and the second impurity regions. For the present invention, at least one impurity region should exist between the first impurity regions 112 and 113, and the second impurity regions 115 and 116, with a lower impurity (phosphorous) concentration, and a higher resistance, than in the first impurity regions 112 and 113.

The resist mask 111 is removed after forming the first impurity regions 112 and 113. Then heat treatment is performed, activating the phosphorous doped into the semiconductor layer. Photo annealing by excimer laser or infrared lamp irradiation can be performed for the activation process, not only the heat treatment.

Figure 4C:
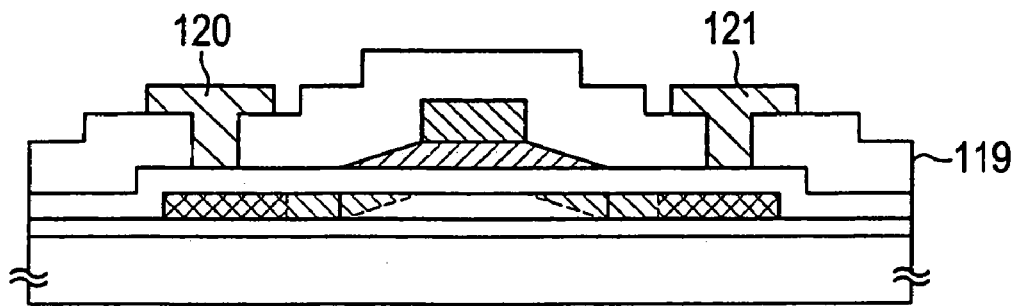

Next an interlayer insulating film 119 is formed from a silicon oxide film, etc. Contact holes are next formed in the gate insulating film 103 and the interlayer insulating film 119 to reach the first impurity regions 112 and 113, and the second gate wiring 107. Then a drain wiring 120, a source wiring 121, and extraction lead wiring for the gate wiring, not shown in the figures, are formed. Thus an NTFT with the structure as shown in FIG. 4C is completed.

Embodiment Mode 2

Embodiment Mode 2 is an example in which the gate electrode (gate wiring) structure is different than in Embodiment Mode 1. Specifically, the gate electrode has a laminated structure of two gate electrodes with different widths in Embodiment Mode 1, but in Embodiment Mode 2 the upper second gate electrode is omitted, and the gate electrode is formed from only a first gate electrode, which has a tapered portion.

Figure 7:
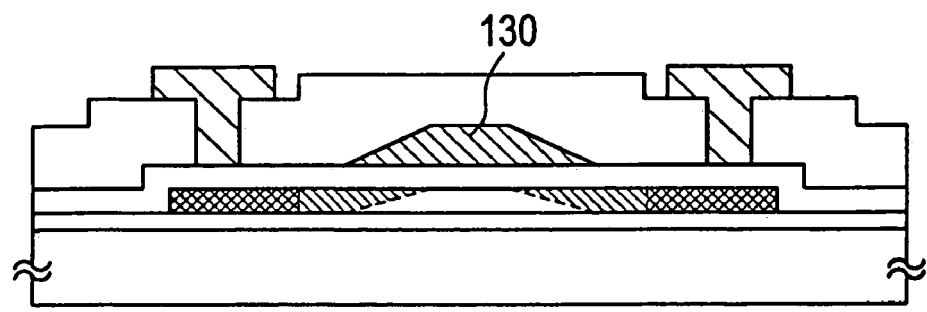
FIG. 7 is a diagram showing the cross sectional structure of an NTFT.

Embodiment Mode 2 is shown in FIG. 7. Note that structurally it is nearly identical to Embodiment Mode 1, so that only the different points are labeled with a reference numeral and explained.

In FIG. 7 the point of difference from the structure shown in FIG. 4C is that a gate electrode 130 is formed from a single layer film. Therefore the explanation of Embodiment Mode 1 applies to all other portions.

A material that can easily be taper etched is desirable for the conductive film that becomes the gate electrode 130. Regarding the thin films that can be used, the material used as the first conductive film 104 in Embodiment Mode 1 may be used.

In addition, the taper angle of the gate electrode 130 is between 3° and 40°. It is desirable that the taper angle be between 5° and 35°, and even better if it is from 7° to 20°. This taper shape can be achieved by a known etching technique, but it is possible to easily obtain a desired taper angle by controlling the bias power density of an etching apparatus that uses high density plasma.

Furthermore, Embodiment Mode 1 may be referred to for detailed conditions of the manufacturing process for forming an NTFT is with the structure of Embodiment Mode 2.

In addition, in Embodiment Mode 2 the second impurity regions may be classified into 4 types as shown in FIGS. 6A to 6D, the same as for Embodiment Mode 1. The resist mask used in forming the second gate electrode 130 determines the channel length for the case of Embodiment Mode 2, in place of the second gate electrode 107.

However, in Embodiment Mode 1 even if the thickness of the first gate electrode 108 is made thinner, by making the second gate electrode 107 thicker it is possible to get low resistance because the gate electrode has a laminate structure. However, the gate electrode 130 is a single layer electrode with a tapered portion in Embodiment Mode 2, so the film thickness becomes thicker than that of the first gate electrode 108, explained in Embodiment Mode 1.

Thus it is possible to lengthen the width WG on the tapered portion by regulating the taper angle, and this is advantageous when one want to lengthen the second impurity regions. On the other hand, phosphorous becomes more difficult to dope by the same amount the film thickness gets thicker due to a small taper angle, and a structure like that of FIG. 6D has been considered.

Simulation Results

The applicant of the present invention investigated by simulation the concentration of phosphorous, and its distribution, doped under the tapered portion of the first gate electrode in the phosphorous doping process shown in FIG. 4A, and the results are is shown in FIG. 12. Note that the ISE (integrated system engineering AG) semiconductor device simulator synthetic package was used for the simulation.

FIG. 12 shows the phosphorous concentration distribution in the edge portion of the first gate electrode. The calculation was performed with a 300 nm thick first gate electrode and a taper angle of 10.5°. Further, the calculation was performed for a case of plasma doping (ion doping) with an acceleration voltage of 110 keV and a phosphorous dose of $1\times10^{15}$ ions/$cm^2$. Note that the gate insulating film thickness was 115 nm, the semiconductor layer film thickness was 50 nm, and the base film (silicon oxide film) thickness was 300 nm.

It can be clearly determined by looking at FIG. 12 that, out of the entire semiconductor layer (shown as Si Layer), the phosphorous concentration changes in the channel length direction in the region under the tapered portion of the first gate electrode. Namely, by moving away from the channel forming region (by moving nearer to the first impurity region), the phosphorous concentration increases and a gradient state strikingly appears.

The acceleration voltage was 110 keV here, but if the acceleration voltages is made higher it can be expected that the phosphorous concentration will get even higher on the inside (the inside of the first gate electrode). Further, the concentration distribution may change by using an ion implantation method. However, the main objects of the present invention are to form this type of phosphorous concentration gradient on the inside of the LDD region (including the portions overlapping the gate electrode), and to enhance the electric field relaxation effect, so the operator may appropriately determine an optimal concentration distribution.

Embodiment 1

Embodiment 1 shows an example in which the NTFT explained in the embodiment modes is used to fabricate an active matrix type liquid crystal display device (AM-LCD).

Figure 8:
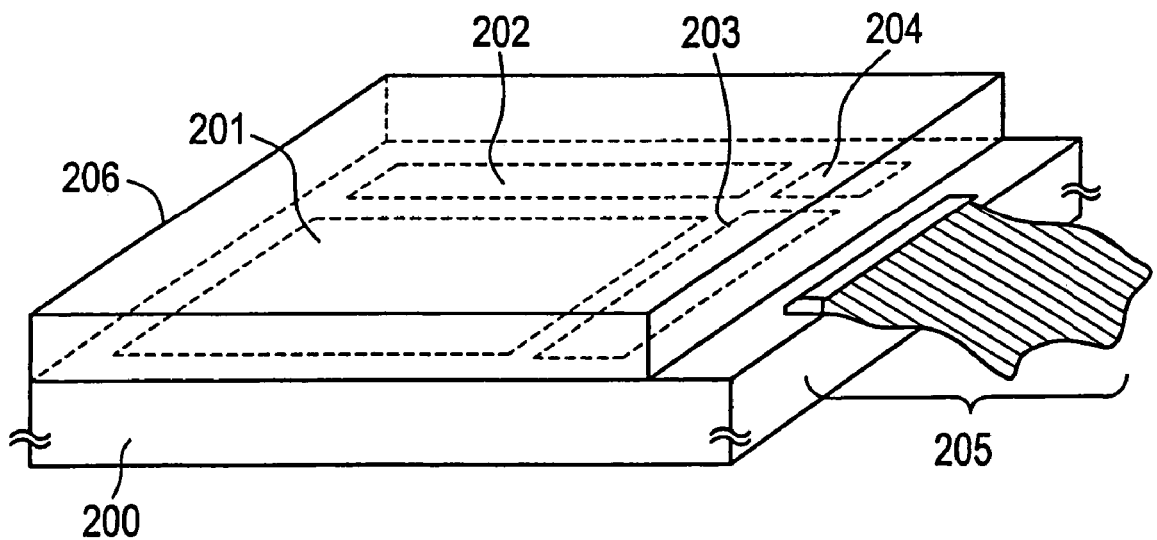
FIG. 8 is a diagram showing an external view of an AM-LCD.

FIG. 8 is a schematic structural view of the AM-LCD of Embodiment 1. The AM-LCD has a structure with a liquid crystal sandwiched between an active matrix substrate 200 and an opposing substrate 206. The active matrix substrate 200 has a pixel region 201, a gate driver circuit 202 that drives the pixel region 201, and a source driver circuit 203 thereon.

These driver circuits are connected to the pixel region 201 by source wirings and drain wirings, respectively.

In addition, a signal processing circuit 204 is formed on the substrate in order to process the video signals transmitted to the source driver circuit 203. A D/A converter circuit, a signal division circuit, a γ correction circuit, etc., can be given as examples of the signal processing circuit. Then, an external terminal is formed in order to input the video signals, and an FPC 205 is connected to the external terminal.

A transparent conductive film such as an ITO film is formed over a surface of a glass opposing substrate 206. The transparent conductive film is an opposing electrode to the pixel electrode in the pixel region 201, and the liquid crystal material is driven by an electric field formed between the pixel electrode and the opposing electrode. Furthermore, if necessary, wiring films, color filters, black masks, etc., may be formed on the opposing substrate 206.

An AM-LCD with the above arrangement has a different minimally required operating voltage (supply voltage) depending upon the circuits. For example, by considering the voltage applied to the liquid crystal and the voltage to drive the pixel TFT in the pixel region, the operating voltage would be between 14 and 20 V. Thus, a TFT that can withstand a high applied voltage (hereinafter referred to as high voltage resistant type TFT) must be used.

Further, an operating voltage having about 5 to 10 V is sufficient for the shift register circuits, etc., used in source driver circuits and gate driver circuits. As the operating voltage gets lower, there are advantages in compatibility with external signals and suppressed power consumption. However, while the above high voltage resistant type TFT has good voltage resistant characteristics, its operating speed is sacrificed, so it is not appropriate in circuits that demand high speed operation such as a shift register circuit.

Thus, the circuits formed on the substrate are classified into circuits that require a TFT that places great importance on voltage resistant characteristics, and into circuits that require a TFT that focuses on operating speed, depending upon their purpose. Therefore, in order to effectively apply the NTFT of the present invention, it is important to apply a structure corresponding to the circuit in use.

The specific structure of Embodiment 1 is shown in FIGS. 1A to 1D. FIG. 1A shows a block diagram of an AM-LCD as seen from above. Reference numeral 11 denotes a pixel region that functions as a display section. Further, reference numeral 12a denotes a shift register circuit, 12b denotes a level shifter circuit, and 12c denotes a buffer circuit. These circuits together form a single gate driver circuit 12.

Note that the AM-LCD includes gate driver circuits 12 to sandwich the pixel region 11 therebetween, as shown in FIG. 1A, both of which share the same gate wiring. In other words, the AM-LCD possesses redundancy so that even if one of the gate driver circuits develops a defect, a voltage can be applied to the gate wiring.

In addition, reference numeral 13a denotes a shift register circuit, 13b denotes a level shifter circuiter circuit, 13c denotes a buffer circuit, and 13d denotes a sampling circuit. These circuits together form a source driver circuit 13. A pre-charge circuit 14 is formed on the side opposite the source driver circuit, sandwiching the pixel region therebetween.

In an AM-LCD with this type of structure, the shift register circuits 12a and 13a are circuits that demand high speed operation, the operating voltage is as low as between 3.3 and 10 V (typically from 3.3 to 5 V), and there is no special requirement for high voltage resistant characteristics. Therefore, when using the NTFT of the present invention, it is desirable that a structure that does not lower the operating speed be employed. In this connection, the second impurity regions and the third impurity regions, which are resistance components, are narrowed to the minimum.

FIG. 1B is a schematic view of a CMOS circuit that must be used in circuits that demand high speed operation, mainly shift register circuits and other signal processing circuits. Note that in FIG. 1B, reference numeral 15 denotes a first gate electrode, 16 denotes a second gate electrode, and only the NTFT has the structure shown in FIG. 4C. Further, reference numeral 17 denotes an active layer, 18 and 19 denote source wirings, and 20 denotes a drain wiring.

Figure 2A:
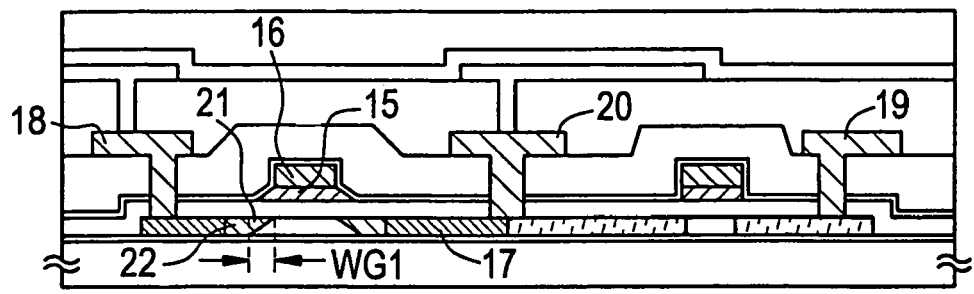
FIGS. 2A to 2C are diagrams showing the cross sectional structure of the AM-LCD circuit.

In addition, the cross sectional structure of the CMOS circuit of FIG. 1B is shown in FIG. 2A. For the case of the structure of FIG. 2A, the length of the second impurity region 21 (WG1) may be between 0.1 and 3.0 μm (preferably between 1.0 and 2.0 μm). This length (WG1) can be controlled by regulating the taper angle of the first gate electrode 15. This is because the second impurity region is formed having a concentration gradient by doping an impurity through the tapered portion of the first gate electrode 15. The taper angle at this point may be between 25° to 40°. However, the appropriate value will change depending upon the film thickness of the first gate electrode 15.

Further, it is appropriate that a third impurity region 22a be as small as possible, and depending upon the circumstances, it may not be formed at all. This is because it is not necessary to be very concerned with the off current in a shift register circuit or a signal processing circuit, etc. If so, it will be formed in the range of 0.1 to 1.5 μm (typically between 0.3 to 1.0 μm).

Summing up the circuit of FIG. 1B, when the power source voltage is 10±2 V the circuit of FIG. 1B, the channel length may be 3.5±1.0 μm, the length of the second impurity region may be 2.0±1.0 μm, and the third impurity region may be made 1.0±0.5 μm. Further, if the power source voltage is 5±2 V, the channel length is 3.0±1.0 μm, the length of the second impurity region is 2.0±1.0 μm, and the third impurity region may be made 0.5±0.2 μm.

Next, the CMOS circuit shown in FIG. 1C is suitable mainly to the level shifter circuits 12b and 13b, to the buffer circuits 12c and 13c, to the sampling circuit 13d, and to the pre-charge circuit 14. The drive voltage is as high as between 14 and 16V because a large current flow is necessary for these circuits. Especially on the gate driver side, depending on the circumstances, there are cases in which it is necessary to have a 19 V drive voltage. Therefore, a TFT with extremely good voltage resistance characteristics (high voltage resistance characteristics) is necessary.

Figure 2B:
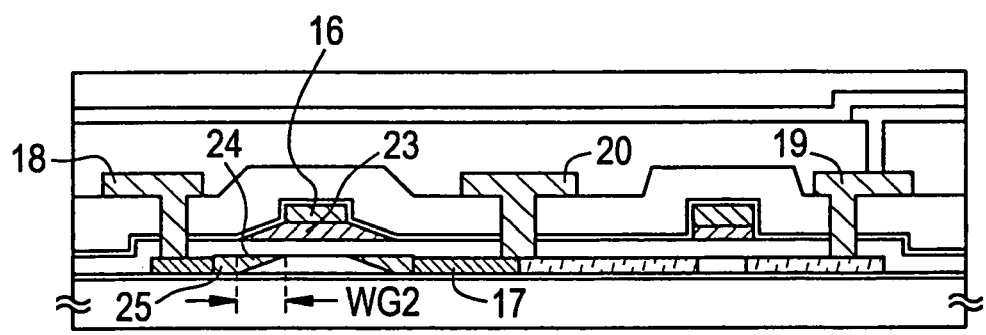

FIG. 2B shows the cross sectional structure of the CMOS circuit shown in FIG. 1C. In this case the length of the second impurity region 24 (WG2) may be between 1.5 and 4.0 μm (preferably from 2.0 to 3.0 μm). Also at this time, by controlling the taper angle on the first gate electrode 23, the desired length can be made. For example, by making the taper angle between 3° and 30°. However, the appropriate value changes depending upon the film thickness of the first gate electrode 23.

In this case as well, it is desirable that the third impurity region 22b be as small as possible, and it is acceptable not to form it. The reason is the same as for the shift register circuit, etc. It is not necessary to be concerned much about the off current. Note that when formed, the third impurity region 25 has a length in the range of 0.1 to 5.5 μm (preferably from 1.0 to 3.0 μm). However, depending on the circumstances, a high voltage of 20 V may be applied to the buffer circuit on the gate driver side, and in that case, it is necessary to form a longer third impurity region to reduce the off current.

Summing up the circuit of FIG. 1C, when the power source voltage is 16±2 V, the channel length may be 5.0±1.5 µm, the length of the second impurity region may be 2.5±1.0 µm, and the third impurity region may be made 2.0±1.0 µm. Further, if the power source voltage is 20±2 V, the channel length may be 5.0±2.0 µm, the length of the second impurity region may be 3.0±1.0 µm, and the third impurity region may be made 4.0±1.5 µm.

Especially for a sampling circuit, the channel length may be 4.0±2.0 µm, the length of the second impurity region may be 1.5±1.0 µm, and the third impurity region may be made 2.0±1.5 µm.

Figure 2C:
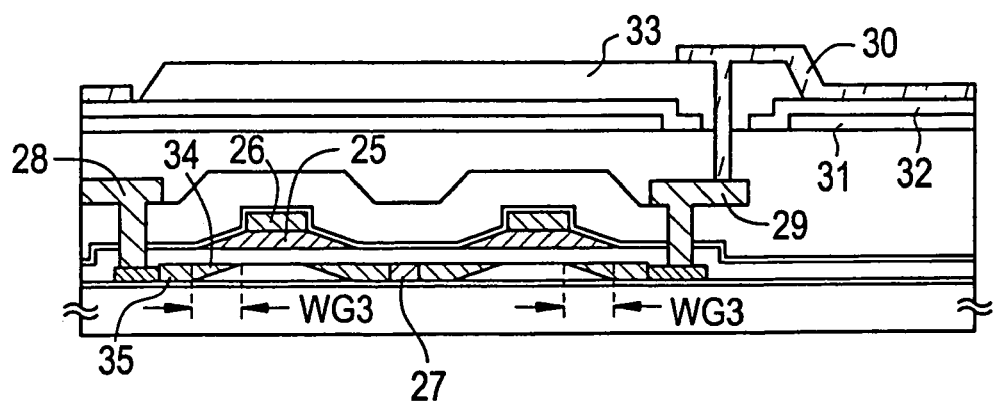

Next, FIG. 1D shows a schematic view of the pixel region 11, and the structure in any cross section of the pixel region is shown in FIG. 2C. In FIG. 1D, reference numeral 25 denotes a first gate wiring (including a first gate electrode), 26 denotes a second gate wiring (including a second gate electrode), 27 denotes an active layer, 28 denotes a source wiring, 29 denotes a drain electrode, and 30 denotes a pixel electrode.

In addition, the pixel electrode 30, which is connected to the drain electrode 29, forms a retention capacitor with an insulating film 32 interposed between the pixel electrode 30 and a transparent conductive film 31, as shown in FIG. 2C. The retention capacitor is formed to occupy the greater part of the pixel region (the region surrounded by the source wiring and the gate wiring). Further, the transparent conductive film 31 is completely separated and insulated from the pixel electrode 30 by an insulating film 33 made of a resin material.

Then, by taking into account that a voltage is applied to the liquid crystal, a 14 to 16 V operating voltage is necessary for the pixel TFT (switching element in the pixel region). In addition, the electric charge that accumulates in the liquid crystal and the retention capacitor must be retained for the period of one frame, so the off current must be as small as possible.

For this reason, a double gate structure is used for the NTFT of the present invention in Embodiment 1, and the length (WG3) of a second impurity region 34 is between 0.5 and 3.0 µm (preferably between 1.5 and 2.5 µm). Further, WG2 (see FIG. 2B) and WG3 may be made the same length, or may be different lengths.

The desired length can be obtained by controlling the taper angle of the first gate electrode 25 at this time as well. For example, the taper angle may be between 3° and 30°. However, the appropriate value changes in accordance with the film thickness of the first gate electrode 25.

Additionally, the pixel region shown in FIG. 2C is characterized in that the third impurity region 35 is made longer than the CMOS circuit shown in FIGS. 2A and 2B. This is because the problem of reducing the off current is the most important problem with the pixel region.

As explained with reference to FIG. 4B, the length of the third impurity region is controlled by the placement of the resist mask. In this case, the length (WG3) of the third impurity region may be from 0.5 to 4.0 µm (preferably from 1.5 to 3.0 µm).

Summing up the circuit of FIG. 1D, when the supply voltage is 16±2 V, the channel length may be 4.0±2.0 µm, the length of the second impurity region may be 1.5±1.0 µm, and the third impurity region may be made 2.0±1.5 µm.

As stated above, various circuits can be formed on a single substrate in the example of an AM-LCD, and the necessary operating voltage (supply voltage) differs depending on the circuit. These results are shown in Table 1.

TABLE 1

| | Supply Voltage (V) | Channel Length (µm) | Length of 2nd Impurity Region (µm) | Length of 3rd Impurity Region (µm) |
|---|---|---|---|---|
| <Driver Circuit> signal processing circuit, shift register circuit, etc. | 10 ± 2 | 3.5 ± 1.0 | 2.0 ± 1.0 | 1.0 ± 0.5 |
| | 5 ± 2 | 3.0 ± 1.0 | 2.0 ± 1.0 | 0.5 ± 0.2 |
| <Driver Circuit> level shifter circuit, buffer circuit, etc. | 16 ± 2 | 5.0 ± 1.5 | 2.5 ± 1.0 | 2.0 ± 1.0 |
| | 20 ± 2 | 5.0 ± 2.0 | 3.0 ± 1.0 | 4.0 ± 1.5 |
| Sampling Circuit | 16 ± 2 | 5.0 ± 2.0 | 1.5 ± 1.0 | 2.0 ± 1.5 |
| Pixel region | 16 ± 2 | 5.0 ± 2.0 | 1.5 ± 1.0 | 2.0 ± 1.5 |

Thus, there are cases in which withstand characteristics to be required may differ so as to correspond to the purpose of the circuit, and it is necessary to adapt the TFT in such a case as in Embodiment 1. It can be stated that the adaptability of the NTFT of the present invention demonstrates its true value.

Embodiment 2

A modified example of the NTFT of Embodiment 1, which constitutes the CMOS circuit and the pixel region is explained in Embodiment 2.

Figure 9A:
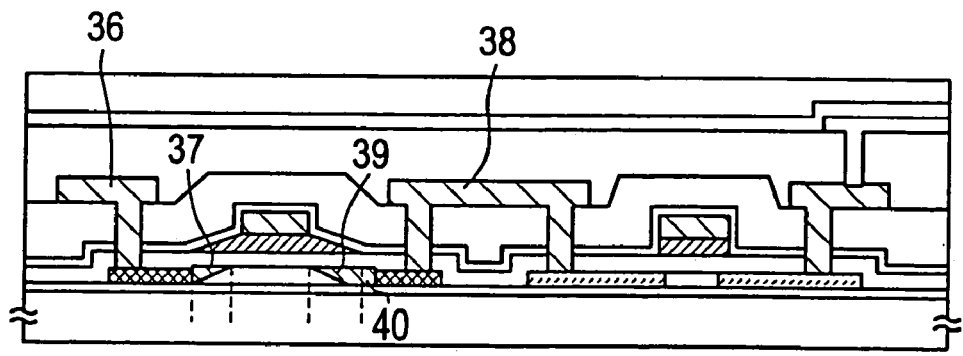
FIGS. 9A to 9C are diagrams showing the cross sectional structure of a CMOS circuit.

FIG. 9A shows a CMOS circuit having the structure suitable for the circuit that requires a high-speed operation, such as a shift register circuit. Characteristic of Embodiment 2 is that a second impurity region 37 is only formed on a source wiring 36 side, and a second impurity region 39 and a third impurity region 40 are formed on a drain wiring 38 side.

A CMOS circuit ordinarily has a fixed source region and drain region, and a low concentration impurity region (LDD region) is only necessary on the drain region side. On the contrary, an LDD region (or an offset region) formed on the source region side simply works as a resistance component, and is a cause of lowered operating speed.

Thus, a structure with the third impurity region formed only on the drain region side is desirable as in Embodiment 2. The third impurity region is formed by using a resist mask, so it is easy to form it only on the drain region side.

Figure 9B:
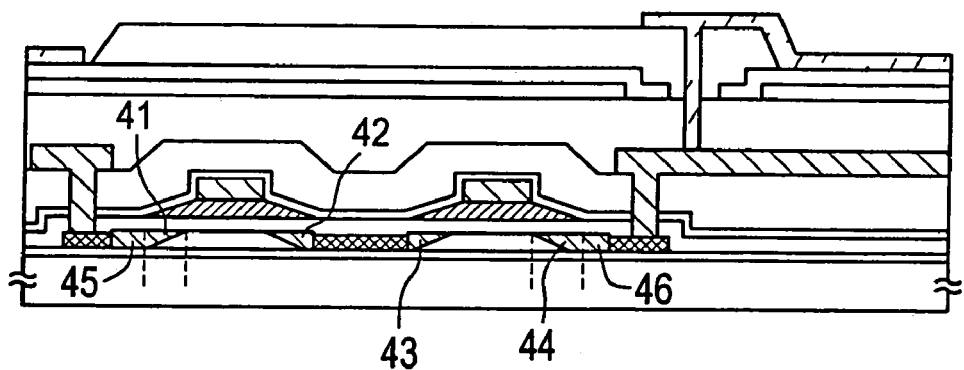

An example case in which the structure of Embodiment 2 is used for a pixel TFT (NTFT) that forms a pixel region is shown in FIG. 9B. In FIG. 9B, reference numerals 41 to 44 denote second impurity regions, and 45 and 46 denote third impurity regions. Note that the structure of FIG. 9B is characterized in that a retention capacitor is formed by a two-layer transparent electrode (typically ITO electrodes), and the manufacturing process of the structure, etc. may be found in Japanese Patent Application Laid-open No. Hei 10-254097, by the applicant of the present invention, which corresponds to a pending U.S. application Ser. No. 09/356,377. An entire disclosure of JP10-254097 and U.S. application Ser. No. 09/356,377 is incorporated herein by reference.

In the case of a pixel TFT, the operating mode is different than that of a CMOS circuit, and the source region and the drain region alternately operate. It is necessary for third impurity regions 45 and 46 to be formed in the area where the pixel TFT and the output terminal (source wiring or drain wiring) connect with each other.

However, for the double gate structure shown in FIG. 9B, second impurity regions 42 and 43, formed to connect the two TFTs, function essentially as resistance components. Moreover, by forming the third impurity regions, an even higher resistance region forms. Therefore, a structure in which a third impurity region (a low concentration impurity region that does not overlap the gate electrode) is not formed between the two TFTs lined up in series is employed for the structure of FIG. 9B.

If a high definition display screen is required for a liquid crystal display device, then the write time to the pixels (the time for the necessary voltage to be applied to the liquid crystals) becomes extremely short. Thus, a certain amount of operating speed is also required for the pixel TFT, and a structure that reduces resistance components as much as possible is necessary. For this reason, it can be stated that the structure of Embodiment 2 is a very preferable.

Figure 9C:
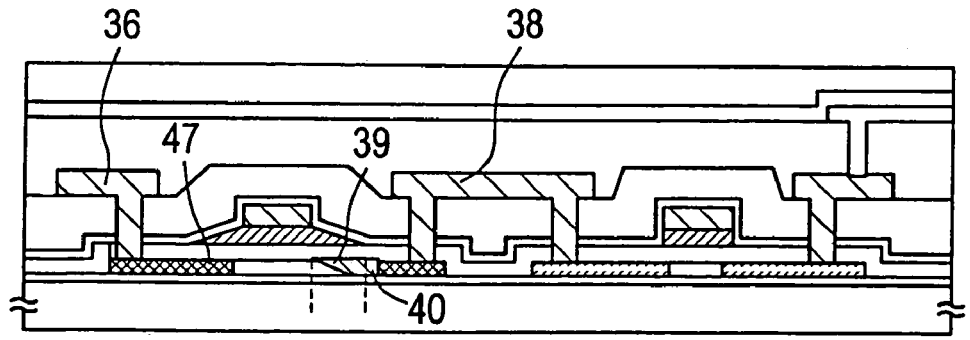

Further, FIG. 9A shows the structure with only the second impurity region 37 is formed on the source wiring 36 side, and with the second impurity region 39 and the third impurity region 40 formed on the drain wiring 38 side. The structure in FIG. 9C is even more remarkable. It is a structure in which neither the second impurity region nor the third impurity region is formed on the source wiring 36 side.

Namely, it is a structure in which the first impurity region (source region) 47, which connects to the source wiring 36, is directly in contact with the channel forming region. Thus, the formation of unnecessary resistance components on the source side can be avoided, and the CMOS circuit capable of a high-speed operation can be realized.

Note that the structure of Embodiment 2 is effective for all of the circuits shown in Embodiment 1. In other words, no third impurity region is formed on the source region side of the NTFT, but a third impurity region is only formed on the drain region side thereof, so that it is possible to increase the operating speed while maintaining high reliability. Of course, Embodiment 2 can be combined with all of the cases shown in FIGS. 6A to 6D.

Embodiment 3

An explanation of the manufacturing process of a CMOS circuit using the present invention is given in Embodiment 3. FIGS. 10A to 10F are used for the explanation.

First, processing is performed in accordance with Embodiment 1 above, through FIGS. 3A, 3B, 3C, and 3D. This state is shown in FIG. 10A. However, FIG. 10A shows an example in which two TFTs (an NTFT on the left, and a PTFT on the right as viewed toward the figure) are formed on the same semiconductor layer.

In FIG. 10A, reference numerals 51 and 52 denote first gate electrodes, 53 and 54 denote second gate electrodes, and 55 and 56 denote resist masks used to form the first gate electrodes or the second gate electrodes. The resist masks 55 and 56 are also used to form the tapers on the first gate electrodes 51 and 52.

Note that in order to make the lengths of the second impurity regions different so as to correspond to the circuits on the same substrate as shown in FIG. 1A, the taper angle on the first gate electrodes must be regulated in correspondence with the operating voltage to operate the circuits. In this case, the circuits with different operating voltages must separately form the taper angles using the resist masks when the first gate electrodes are formed.

Next, a phosphorous doping process is performed using the second gate electrodes 53 and 54 as masks, forming n⁻-type impurity regions 57 to 59. Embodiment 1 may be referred to for the doping conditions. Phosphorous is doped by penetrating the first gate electrodes at the tapered portions of the first gate electrodes 51 and 52, where the impurity regions are formed which exhibits concentration gradients as explained by using FIGS. 6A to 6D (see FIG. 10B).

Next, a resist mask 60 is formed, and after that, a phosphorous doping process is again performed, forming n⁺-type impurity regions 61 to 63. A third impurity region explained with reference to FIGS. 6A to 6D is defined by the resist mask 60. In order to change the length of the third impurity region to correspond to circuits with different operating voltages, only the width of the resist mask may be changed (see FIG. 10C).

The NTFT of the CMOS circuit is completed when the processes of FIG. 10C end. Next, the second gate electrode 54 of the PTFT is used as a mask and the first gate electrode 52 is etched in a self-aligning manner, removing the tapered portion. Thus, a first gate electrode 64 is formed with the same shape as the second gate electrode. Note that there is no problem if this process is omitted (see FIG. 10D).

Next, a resist mask 65 is formed so as to cover the NTFT, and a boron doping process is performed under the conditions of Embodiment 1. The above n⁻-type impurity regions and n⁺-type impurity regions are both inverted by this process, forming p⁺⁺-type impurity regions 66 and 67 (see FIG. 10E).

Then, after removing the resist mask 65, the first gate electrodes and the second gate electrodes are covered with a silicon nitride film 68, and doped phosphorous and doped boron are activated. This process may be performed in free combination of furnace annealing, laser annealing, and lamp annealing. Further, the silicon nitride film 68 is intended to protect the first gate electrodes and the second gate electrodes from heat and oxidation reactions.

Next, an interlayer insulating film 69 is formed on the silicon nitride film 68, and after forming contact holes, source wirings 70 and 71, and a drain wiring 72 are formed. Thus a CMOS circuit with the structure shown in FIG. 10F can be obtained.

Note that one example of a CMOS circuit that uses the NTFT of the present invention is shown in Embodiment 3, but it is not necessary to place limitations on the structure of the CMOS circuit of Embodiment 3. Further, in cases of realizing the arrangement shown in FIGS. 1A to 1D, it is necessary to change the taper angle on the first gate electrodes separately for each circuit with a different operating voltage.

Furthermore, it is possible to freely combine the structure of Embodiment 3 freely with the structures of Embodiments 1 and 2.

Embodiment 4

In Embodiment 4, etching conditions, in order to taper the side face of the first gate electrode on the NTFT of the present invention, are explained. In Embodiment 4, the conductive film that forms the first gate electrode is formed by sputtering, using a tungsten target with a purity of 6N (99.9999%) or greater. An inert gas may be used as the sputtering gas, but a tungsten nitride film can be formed by adding nitrogen ($N_2$).

A laminate structure is used in Embodiment 4, with a 370 nm tungsten film on a 30 nm tungsten nitride film. However, it is all right not to form the tungsten nitride film, and a silicon film may be formed under the tungsten nitride film. Further, a laminate film with a tungsten nitride film on a tungsten film may be formed.

The laminate film thus obtained has an oxygen content of 30 ppm or less. Due to this, the electrical resistivity can be made 20 μΩ cm or less, typically between 6 and 15 μΩ cm, and the film stress can be between $-5 \times 10^9$ and $5 \times 10^9$ dyn/$cm^2$.

Next, a resist pattern is formed on the above laminate film, and etching is performed on the laminate film, forming a first gate electrode. At this point, in Embodiment 4, an ICP (Inductively Coupled Plasma) etching apparatus using a high density plasma is employed for the patterning the laminate film.

Figure 13:
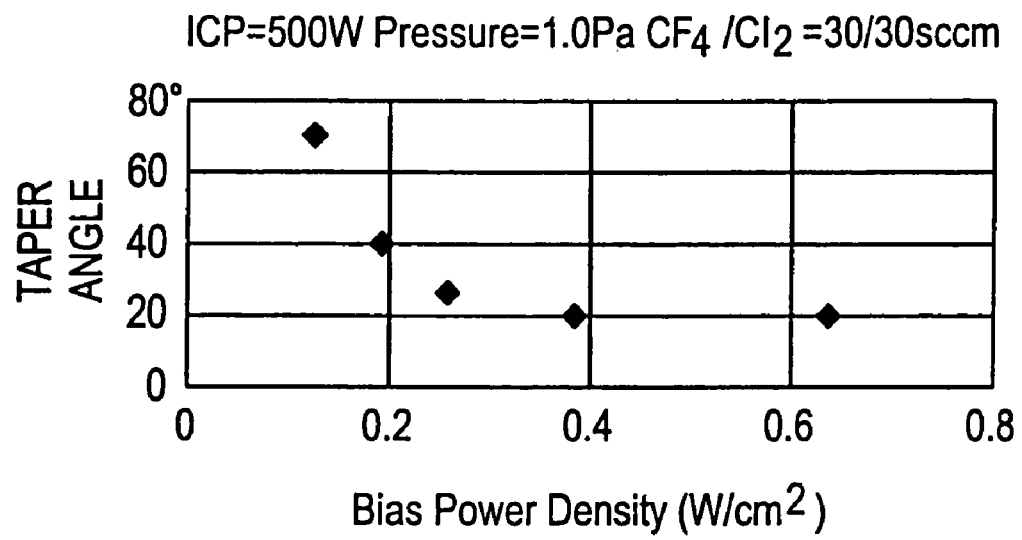
FIG. 13 is a diagram showing the relationship between bias power density and taper angle.

Embodiment 4 is characterized by the regulation of the bias power density on the ICP etching apparatus in order to obtain a desired taper angle. FIG. 13 is a view showing the dependence of the taper angle on bias power. As shown in FIG. 13, the taper angle can be controlled in accordance with the bias power density.

The taper angle is 20° in Embodiment 4, so the bias power density is set to 0.4 W/cm$^2$. Of course, the taper angle can be made to be 20° if setting the bias power not lower than 0.4 W/cm$^2$. Note that the ICP power is 500 W, the gas pressure is 1.0 Pa, and the gas flow rate $CF_4/Cl_2$ is 30/30 sccm.

Figure 14:
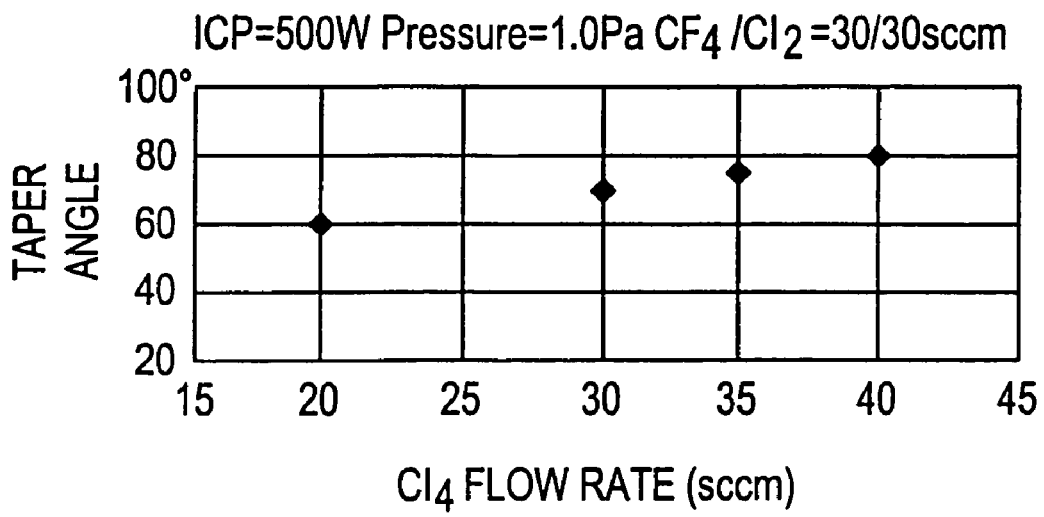
FIG. 14 is a diagram showing the relationship between $CF_4$ flow rate and taper angle.

In addition, the taper angle can also be controlled by regulating the flow rate ratio of $CF_4$ in the etching gas (of $CF_4$ and $Cl_2$ gas mixture). FIG. 14 is a view showing the dependence on the taper angle and the $CF_4$ flow rate ratio. If the $CF_4$ flow rate ratio is increased, the selectivity ratio between the tungsten film and the resist gets larger, and the taper angle of the first gate electrode substantially increases in proportion to the $CF_4$ flow rate ratio.

Figure 15:
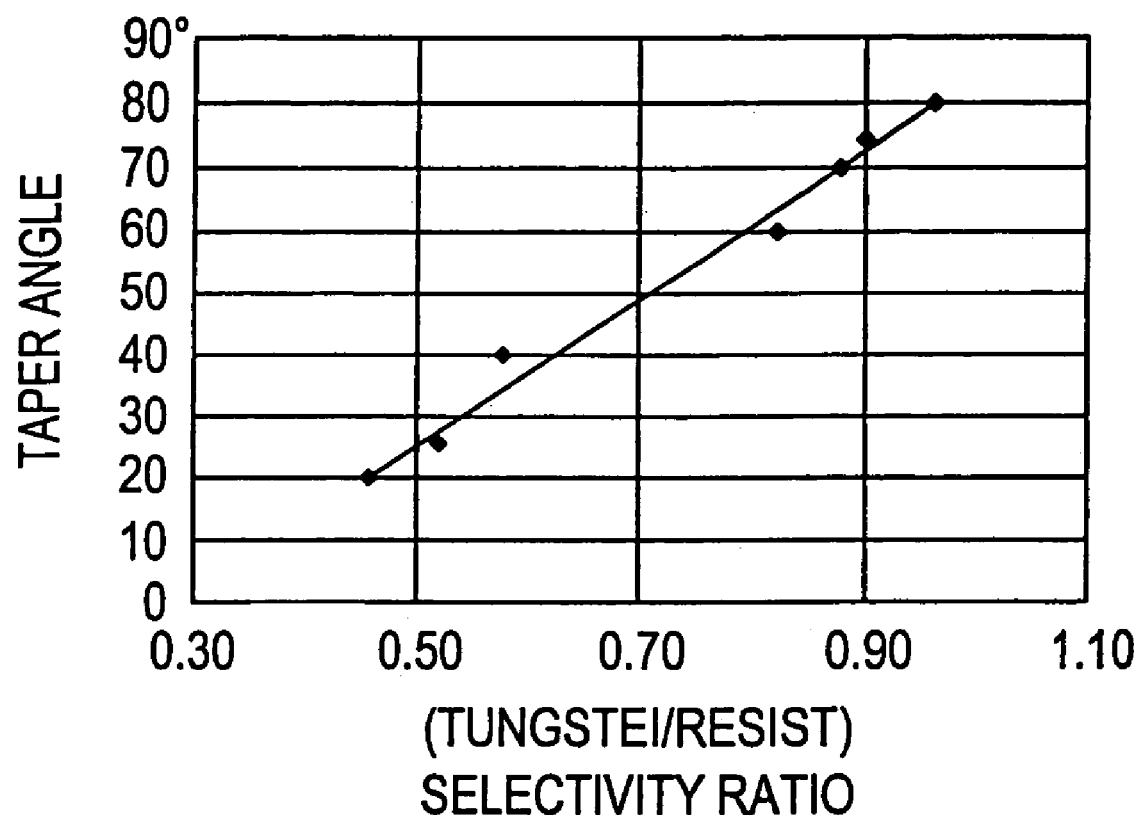
FIG. 15 is a diagram showing the relationship between W/resist selection ratio and taper angle.

Thus, the taper angle is changed depending on the selectivity ration between the tungsten film and the resist. A relationship of the tungsten film/resist selectivity ratio and the taper angle is shown in FIG. 15. As is evident from FIG. 15, a proportional relationship between the tungsten film/resist selectivity ratio and the taper angle can be seen.

As described above, the taper angle that occurs on the side face of the first gate electrodes can be easily controlled by using an ICP etching apparatus to regulate the bias power density and the reactive gas flow ratio. Note that although the experimental data only shows taper angles in the range of 20° to 80°, angles not greater than 20° (from 3° to 20°) can also be formed by setting the conditions appropriately.

Also, note that a tungsten film is shown as one example in Embodiment 4, but by using an ICP etching apparatus, for conductive films such as Ta, Ti, Mo, Cr, Nb, Si, etc., a tapered shape can easily be made on the edge of a pattern.

In addition, an example is given in which a $CF_4$ and $Cl_2$ gas mixture is used as the etching gas, but it is not necessary to limit the etching gas to this mixture, and it is possible to use a gas mixture of a reactive gas containing fluorine, selected from $C_2F_6$ or $C_4F_8$, and a gas containing chlorine, selected from $Cl_2$, $SiCl_4$, or $BCl_3$. Furthermore, a gas mixture of $CF_4$ and $Cl_2$ added with 20-60% oxygen may be used as an etching gas.

The etching technique of Embodiment 4 may be combined with the structure of any of Embodiment Mode 1, Embodiment Mode 2, and Embodiments 1 to 3.

Embodiment 5

It is possible to apply the structure of the present invention to all semiconductor circuits, not only the liquid crystal display device of Embodiment 1. Namely, the present invention may be applied to micro processors such as RISC processors, ASIC processors, etc., and a range from signal processing circuits such as D/A converters, etc. to high frequency circuits of portable devices (portable telephones, PHS, mobile computers).

In addition, it is possible to realize semiconductors devices with three dimensional structures by manufacturing a semiconductor circuit using the present invention on an interlayer insulating film formed on a conventional MOSFET. Thus, it is possible to apply the present invention to all semiconductor devices in which current LSIs are used. In other words, the present invention may be applied to SOI structures (TFT structures using single crystal semiconductor thin films) such as SIMOX, Smart-Cut (a trademark of SOITEC Co.), ELTRAN (a trademark of Canon, Inc.), etc.

Further, the semiconductor circuits of Embodiment 5 can be realized using any combination of Embodiments 1 to 4.

Embodiment 6

This example demonstrates a process for producing an active matrix type EL (electroluminescence) display device according to the invention of the present application.

Figure 16A:
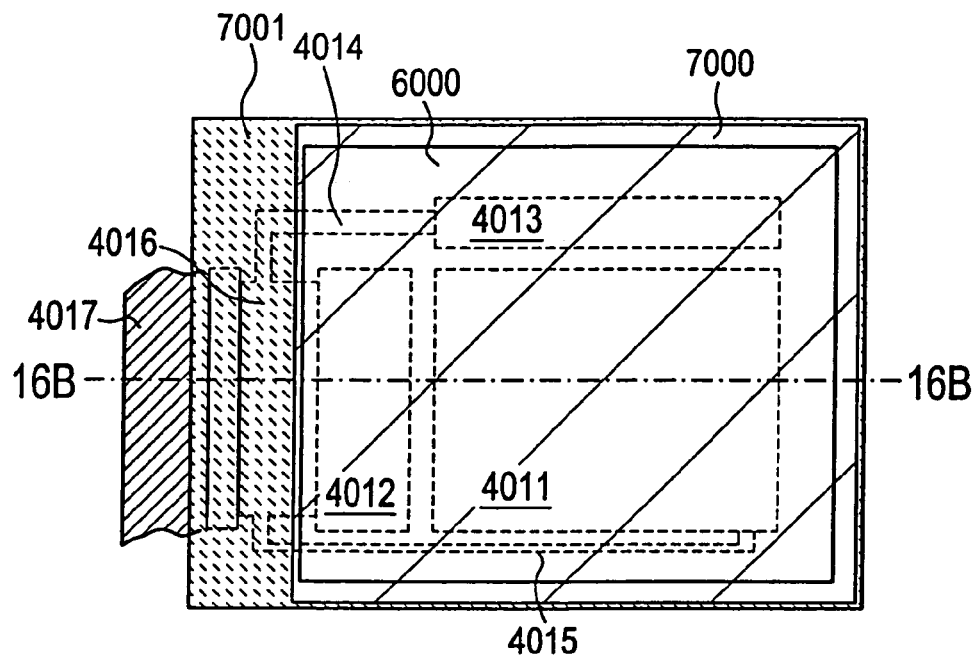
FIGS. 16A to 16B are views showing a structure of an active matrix type EL display panel.

FIG. 16A is a top view showing an EL display device, which was produced according to the invention of the present application. In FIG. 16A, there are shown a substrate 4010, a pixel portion 4011, a source side driving circuit 4012, and a gate side driving circuit 4013, each driving circuit connecting to wirings 4014 to 4016 which reach FPC (Flexible Print Circuit) 4017 leading to external equipment.

The pixel portion, preferably together with the driving circuit, is enclosed by a covering material 6000, a first sealing material (or housing material) 7000, and a second sealing material (or second sealing material) 7001.

Figure 16B:
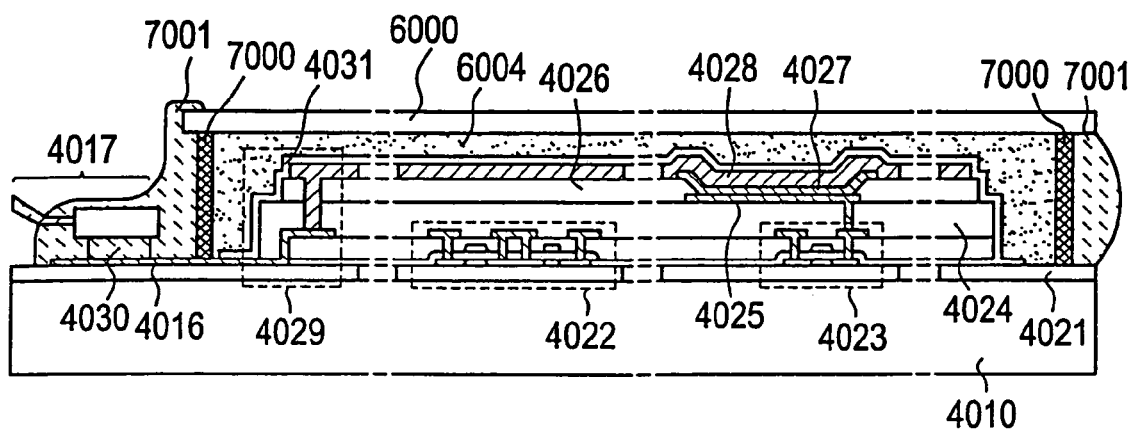

FIG. 16B is a sectional view showing the structure of the EL display device in this Embodiment. There is shown a substrate 4010, a base film 4021, a driving circuit portion 4022 (a CMOS circuit consisting of an NTFT and a PTFT is shown here), and a pixel portion 4023. (The TFT shown in FIG. 16B is the one, which controls current to the EL element.)

In this embodiment, the CMOS circuit shown in FIG. 2A is used in the driving circuit portion 4022. Also, the TFT which controls current to the EL element (current control TFT) can use an NTFT shown in FIG. 9C, and a TFT which switches a gate signal of the current control TFT (switching TFT) can use the TFT shown in FIG. 2C.

Upon completion of the driving circuit portion 4022 and the pixel portion 4023 according to the invention of the present application, a pixel electrode (cathode) 4025 is formed on the interlayer insulating film (planarizing film) 4024 made of a resin. This pixel electrode 4025 is electrically connected to the drain of TFT 4023 for the pixel portion and may comprise a light-shielding conductive film (representatively, a conductive film including aluminum, copper, or silver as the main component or a laminated film consisting of the above conductive film and another conductive film). Then, an insulating film 4026 is formed on the pixel electrode 4025, and an opening in the insulating film 4026 is formed above the pixel electrode 4025.

Subsequently, the EL (electroluminescence) layer 4027 is formed. It may be of single-layer structure or multi-layer structure by freely combining known EL materials such as a hole injection layer, a hole transport layer, a light emitting layer, an electron transport layer, and an electron injection layer. Any known technology may be available for such structure. The EL material is either a low-molecula r material or a high-molecular material (polymer). The former may be applied by vapor deposition, and the latter may be applied by a simple method such as spin coating, printing, or ink-jet method.

In this example, the EL layer is formed by vapor deposition through a shadow mask. The resulting EL layer permits each pixel to emit light differing in wavelength (red, green, and blue). This realizes the color display. Alternative systems available include the combination of color conversion layer (CCM) and color filter and the combination of white light emitting layer and color filter. Needless to say, the EL display device may be monochromatic.

An anode 4028 comprising a transparent conductive film is formed on the EL layer 4027. The transparent conductive film may be formed from a compound of indium oxide and tin oxide or a compound of indium oxide and zinc oxide. It is desirable to clear moisture and oxygen as much as possible from the interface between the EL layer 4027 and the anode 4028. Accordingly, the object may be achieved by forming the EL layer 4027 and the anode 4028 subsequently in a vacuum, or by forming the EL layer 4027 in an inert atmosphere and then forming the anode 4028 in the same atmosphere without exposing to air. In this Example, the desired film was formed by using a film-forming apparatus of multichamber system (cluster tool system).

The anode 4028 is connected to wiring 4016 at a region 4029. The wiring 4016 is a wiring to supply a prescribed voltage to the anode 4028 and is electrically connected to the FPC 4017 through a conductive material 4030.

In the region 4029, the electrical connection between the anode 4028 and the wiring 4016 needs contact holes in the interlayer insulating film 4024 and the insulating film 4026. These contact holes may be formed when the interlayer insulating film 4024 undergoes etching to form the contact hole for the pixel electrode or when the insulating film 4026 undergoes etching to form the opening before the EL layer is formed. When the insulating film 4026 undergoes etching, the interlayer insulating film 4024 may be etched simultaneously. Contact holes of good shape may be formed if the interlayer insulating film 4024 and the insulating film 4026 are made of the same material.

Then, a passivation film 4031 is formed so as to cover the surface of the EL element. Moreover the first sealing material 7000 is formed so as to surround the EL element and to put a covering material 6000 on the substrate 4010. Then a filling material 6004 are formed within a region surrounded by the substrate 4010, the covering material 6000, and the first sealing material 7000.

The filling material 6004 also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a hygroscopic material (e.g. barium oxide) in the filling material 6004, since a moisture absorption effect can be maintained.

Also, spacers can be contained in the filling material 6004. It is preferable to use spherical spacers comprising barium oxide to maintain the moisture absorption in the spacers.

In the case of that the spaces are contained in the filling material, the passivation film 4031 can relieve the pressure of the spacers. Of course, the other film different from the passivation film, such as an organic resin, can be used for relieving the pressure of the spacers.

Moreover, in stead of the filling material, an inert gas (such as argon, helium, and nitrogen) can be introduced into the region surrounded by the substrate 4010, the covering material 6000, and the first sealing material 7000.

As the covering material 6000, a glass plate, a FRP (Fiberglass-Reinforced Plastics) plate, a PVF (polyvinyl fluoride) film, a Mylar film, a polyester film or an acryl film can be used. In this embodiment, the covering material should be a transparent material because the light emitted from the EL element goes toward the covering material 6000.

However, when the light emitted from the EL element goes in the opposite direction, a metal plate (e.g. a stainless steel plate), a ceramics plate, and an aluminum foil sandwiched by a PVF film or a Mylar film can be used as the covering material 6000.

The wiring 4016 is electrically connected to FPC 4017 through the gap between the first sealing material 7000 and the substrate 4010. As in the wiring 4016 explained above, other wirings 4014 and 4015 are also electrically connected to FPC 4017 under the first sealing material 7000.

Finally, a second sealing material 7001 is form so as to cover exposed potions of the first sealing material 7000 and a portion of the FPC 4017 for obtaining a structure that cut of the air completely. Accordingly, the EL display device having a cross section shown in FIG. 16B is obtained.

By incorporating the EL display device as described in this Embodiment into the present invention, it is advantageous to obtain an EL display device having a high reliability. The constitution of this Embodiment can be combined with any constitution of Embodiments 1 to 5 in any desired manner.

Embodiment 7

Figure 17:
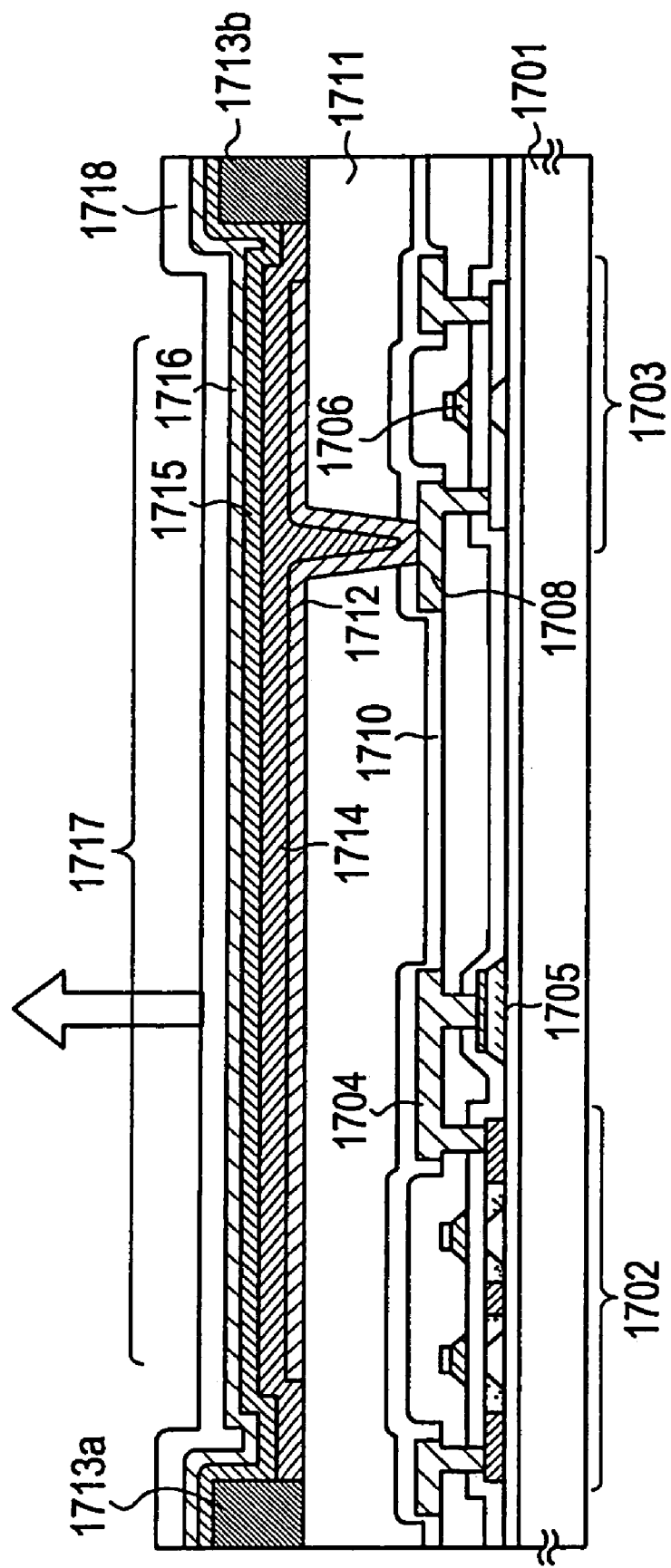
FIG. 17 is a view showing a cross section of a pixel portion in the an active matrix type EL display panel.
Figure 18A:
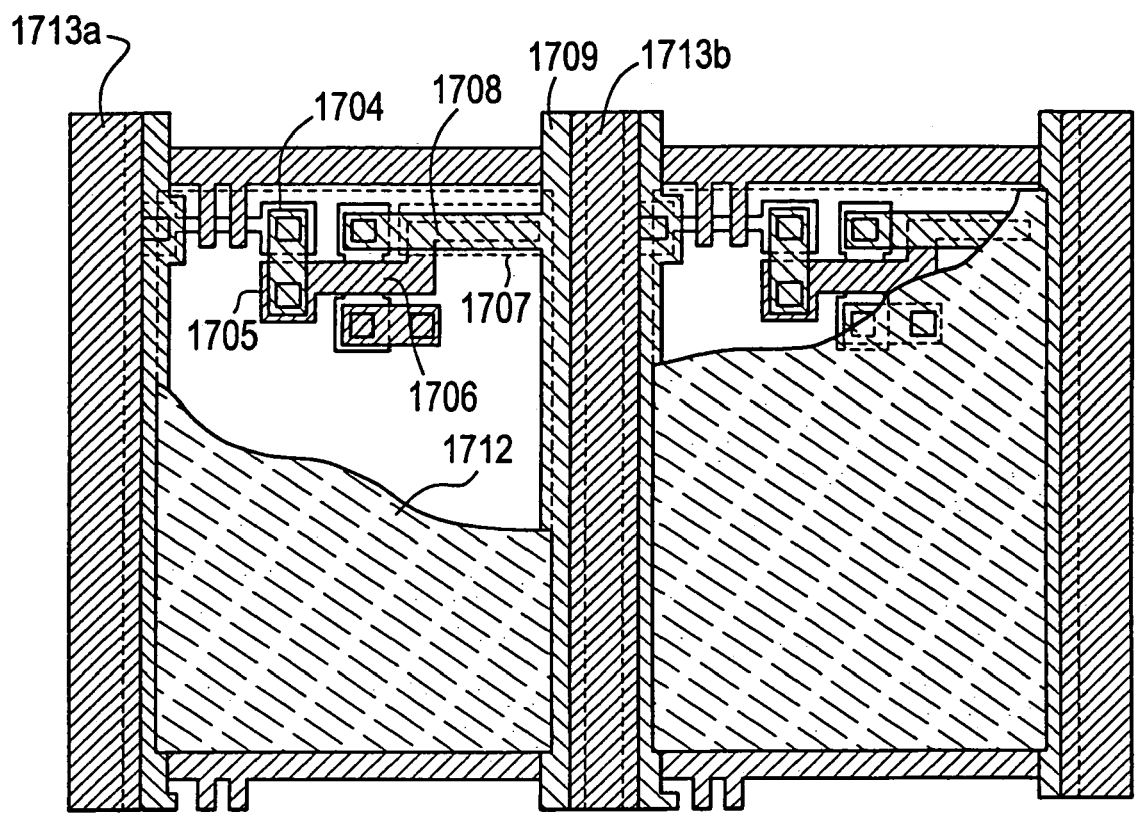
FIGS. 18A to 18B are views showing a structure of the pixel portion in an active matrix type EL display panel and a circuit structure for the pixel portion, respectively.
Figure 18B:
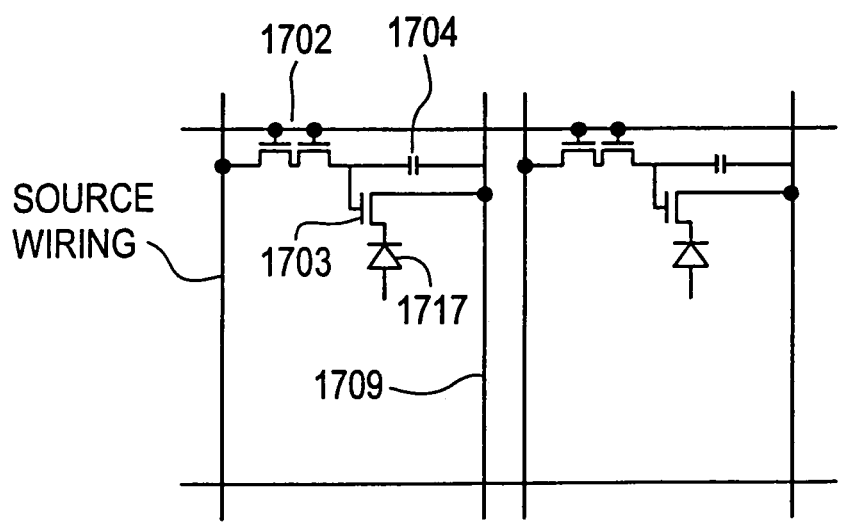

In this embodiment, the structure of the pixel region in the EL display device in Embodiment 6 is illustrated in more detail. FIG. 17 shows the cross section of the pixel region; FIG. 18A shows the top view thereof; and FIG. 18B shows the circuit structure for the pixel region. In FIG. 17, FIG. 18A and FIG. 18B, the same reference numerals are referred to for the same portions, as being common thereto.

In FIG. 17, the switching TFT 1702 formed on the substrate 1701 is NTFT having the structure shown in FIG. 2C. In this Embodiment, it has a double-gate structure. The double-gate structure of the switching TFT 1702 has substantially two TFTs as connected in series, and therefore has the advantage of reducing the off-current to pass therethrough.

In this Embodiment, the switching TFT 1702 has such a double-gate structure, but is not limitative. It may have a single-gate structure or a triple-gate structure, or even any other multi-gate structure having more than three gates. As the case may be, the switching TFT 1702 may be PTFT as shown in FIG. 2A or 2B.

The current-control TFT 1703 is NTFT as shown in FIG. 9C. The drain wire 1704 in the switching TFT 1702 is electrically connected with the gate electrode 1706 of the current-control TFT 1703 via the wire 1705.

It is very important that the current-control TFT 1703 has the structure defined in the invention. The current-control TFT is an element for controlling the quantity of current that passes through the EL device. Therefore, a large quantity of current passes through it, and the element, current-control TFT has a high risk of thermal degradation and degradation with hot carriers. To this element, therefore, the structure of the invention is extremely favorable, in which an LDD region is so constructed that the gate electrode overlaps with the drain area in the current-control TFT, via a gate insulating film therebetween.

In this Embodiment, the current-control TFT 1703 is illustrated to have a single-gate structure, but it may have a multigate structure with plural TFTs connected in series. In addition, plural TFTs may be connected in parallel so that the channel forming region is substantially divided into plural sections. In the structure of that type, heat radiation can be effected efficiently. The structure is advantageous for protecting the device with it from thermal deterioration.

As in FIG. 18A, the wire to be the gate electrode 1706 in the current-control TFT 1703 overlaps with the drain wire 1708 of the current-control TFT in the region indicated by 1707, with an insulating film interposed therebetween. In this state, the region indicated by 1707 forms a capacitor. The capacitor 1707 functions to retain the voltage applied to the gate electrode in the current-control TFT 1703. The drain wire 1708 is connected with the current supply line (power line) 1709.

On the switching TFT 1702 and the current-control TFT 1703, a first passivation film 1710 is formed. On the film 1710, formed is a planarizing film 1711 of an insulating resin. It is extremely important that the difference in level of the layered portions in TFT is removed through planarization with the planarizing film 1711. This is because the EL layer to be formed on the previously formed layers in the later step is extremely thin, and if there exist a difference in level of the previously formed layers, the EL device will be often troubled by light emission failure. Accordingly, it is desirable to previously planarize as much as possible the previously formed layers before the formation of the pixel electrode thereon so that the EL layer could be formed on the planarized surface.

The reference numeral 1712 indicates a pixel electrode (a cathode in the EL device) of an conductive film with high reflectivity. The pixel electrode 1712 is electrically connected with the drain region in the current-control TFT 1703. In this case, it is preferable that an NTFT is used as the current-control TFT 1703. Also, it is preferable that the pixel electrode 1712 is of a low-resistance conductive film of an aluminum alloy, a copper alloy or a silver alloy, or of a laminate of those films. Needless-to-say, the pixel electrode 1712 may have a laminate structure with any other conductive films.

In the recess.(this corresponds to the pixel) formed between the banks 1713a and 1713b of an insulating film (preferably of a resin), the light-emitting layer 1714 is formed. In the illustrated structure, only one pixel is shown, but plural light-emitting layers could be separately formed in different pixels, corresponding to different colors of R (red), G (green) and B (blue). In this Embodiment, the organic EL material for the light-emitting layer may be any π-conjugated polymer material. Typical polymer materials usable herein include polyparaphenylenevinylene (PVV) materials, polyvinylcarbazole (PVK) materials, polyfluorene materials, etc.

Various types of PVV-type organic EL materials are known, such as those disclosed in H. Shenk, H. Becker, O. Gelsen, E. Klunge, W. Kreuder, and H. Spreitzer; Polymers for Light Emitting Diodes, Euro Display Proceedings, 1999, pp. 33-37 and in Japanese Patent Laid-Open No. 10-92576 (1998). Any of such known materials are usable herein.

Concretely, cyanopolyphenylenevinylenes may be used for red-emitting layers; polyphenylenevinylenes may be for green-emitting layers; and polyphenylenevinylenes or polyalkylphenylenes may be for blue-emitting layers. The thickness of the film for the light-emitting layers may fall between 30 and 150 nm (preferably between 40 and 100 nm).

These compounds mentioned above are referred to merely for examples of organic EL materials employable herein and are not limitative at all. The light-emitting layer may be combined with a charge transportation layer or a charge injection layer in any desired manner to form the intended EL layer (this is for light emission and for carrier transfer for light emission).

Specifically, this embodiments to demonstrate an embodiment of using polymer materials to form light-emitting layers, which, however, is not limitative. Low-molecular organic EL materials may also be used for light-emitting layers. For charge transportation layers and charge injection layers, further employable are inorganic materials such as silicon carbide, etc. Various organic EL materials and inorganic materials for those layers are known, any of which are usable herein.

In this Embodiment, a hole injection layer 1715 of PEDOT (polythiophene) or PAni (polyaniline) is formed on the light-emitting layer 1714 to give a laminate structure for the EL layer. On the hole injection layer 1715, formed is an anode 1716 of a transparent conductive film. In this Embodiment, the light having been emitted by the light-emitting layer 1714 radiates therefrom in the direction toward the top surface (that is, in the upward direction of TFT). Therefore, in this, the anode must transmit light. For the transparent conductive film for the anode, usable are compounds of indium oxide and tin oxide, and compounds of indium oxide and zinc oxide. However, since the anode is formed after the light-emitting layer and the hole injection layer having poor heat resistance have been formed, it is preferable that the transparent conductive film for the anode is of a material capable of being formed into a film at as low as possible temperatures.

When the anode 1716 is formed, the EL device 1717 is finished. The EL device 1717 thus fabricated herein indicates a capacitor comprising the pixel electrode (cathode) 1712, the light-emitting layer 1714, the hole injection layer 1715 and the anode 1716. As in FIG. 18A, the region of the pixel electrode 1712 is nearly the same as the area of the pixel. Therefore, in this, the entire pixel functions as the EL device. Accordingly, the light utility efficiency of the EL device fabricated herein is high, and the device can display bright images.

In this Embodiment, a second passivation film 1718 is formed on the anode 1716. For the second passivation film 1718, preferably used is a silicon nitride film or a silicon nitride oxide film. The object of the film 1718 is to insulate the EL device from the outward environment. The film 1718 has the function of preventing the organic EL material from being degraded through oxidation and has the function of preventing it from degassing. With the second passivation film 1718 of that type, the reliability of the EL display device is improved.

As described hereinabove, the EL display device of the invention fabricated in this Embodiment has a pixel portion for the pixel having the constitution as in FIG. 17, and has the switching TFT through which the off-current to pass is very small to a satisfactory degree, and the current-control TFT resistant to hot carrier injection. Accordingly, the EL display device fabricated herein has high reliability and can display good images.

The constitution of this Embodiment can be combined with any constitution of Embodiments 1 to 5 in any desired manner.

Embodiment 8

This Embodiment is to demonstrate a modification of the EL display device of Embodiment 7, in which the EL device 1717 in the pixel portion has a reversed structure. For this Embodiment, referred to is FIG. 19. The constitution of the EL display panel of this Embodiment differs from that illustrated in FIG. 18A only in the EL element portion and the current-control TFT portion. Therefore, the description of the other portions except those different portions is omitted herein, and the same reference numerals are referred to for the same portions, as being common thereto.

Figure 19:
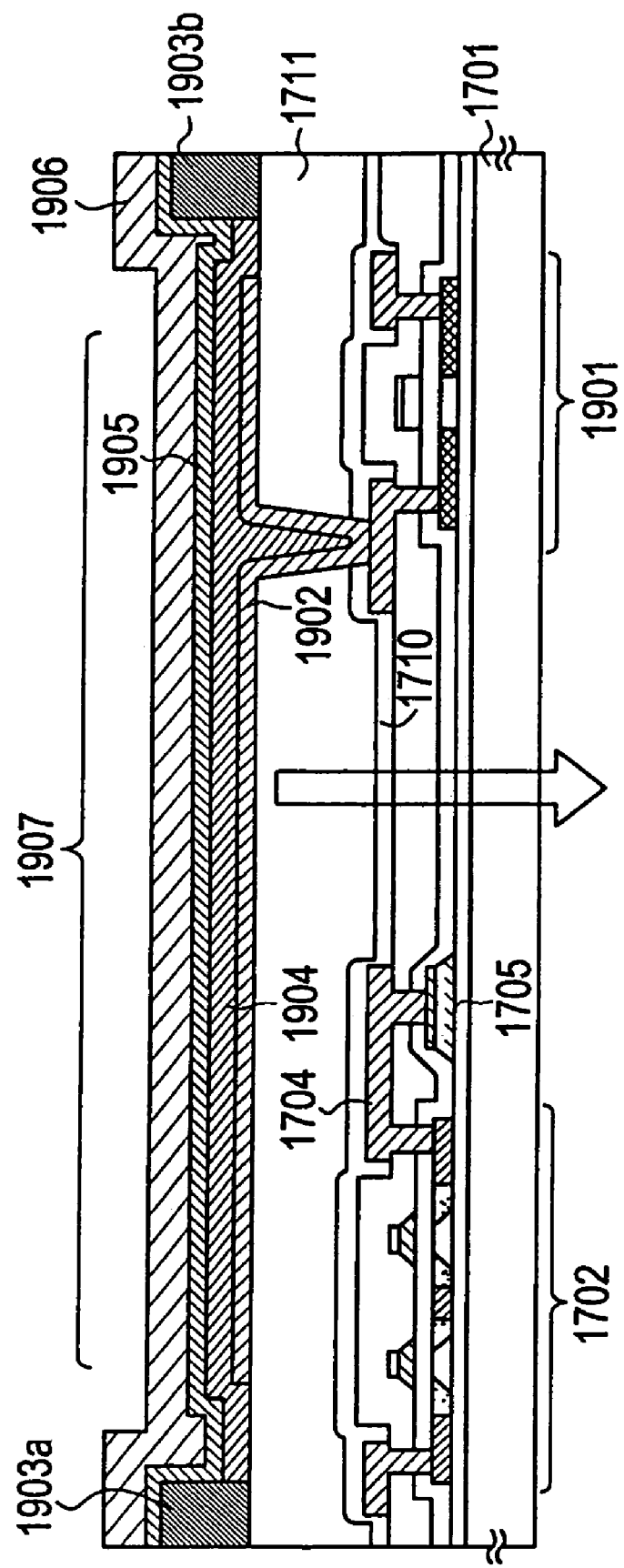
FIG. 19 is a view showing a structure of a pixel portion in an active matrix type EL display panel.

In FIG. 19, the current-control TFT 1901 may be PTFT formed by the steps described in Embodiment 3.

In this Embodiment, the pixel electrode (anode) 1902 is of a transparent conductive film. Concretely, used is an conductive film of a compound of indium oxide and zinc oxide. Needless-to-say, also usable is an conductive film of a compound of indium oxide and tin oxide.

After the banks 1903a and 1903b of an insulating film have been formed, a light-emitting layer 1904 of polyvinylcarbazole is formed between them in a solution coating method. On the light-emitting layer 1904, formed are an electron injection layer 1905 made of alkali metal complex (e.g. acetylacetonatopotassium), and a cathode 1906 of an aluminum alloy. In this case, the cathode 1906 serves also as a passivation film. Thus is fabricated the EL device 1907.

In this Embodiment, the light having been emitted by the light-emitting layer 1904 radiates in the direction toward the substrate with TFT formed thereon, as in the direction of the arrow illustrated.

The constitution of this Embodiment can be combined with any constitution of Embodiments 1 to 5 in any desired manner.

Embodiment 9

This Embodiment is to demonstrate modifications of the pixel with the circuit structure of FIG. 18B. The modifications are as in FIG. 20A to FIG. 20C. In this Embodiment illustrated in those FIG. 20A to FIG. 20C, 3801 indicates the source wire for the switching TFT 3802; 3803 indicates the gate wire for the switching TFT 3802; 3804 indicates a current-control TFT; 3805 indicates a capacitor; 3806 and 3808 indicate current supply lines; and 3807 indicates an EL device.

Figure 20A:
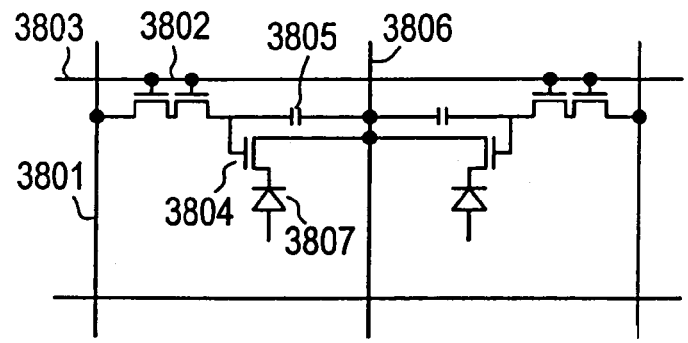
FIGS. 20A-20C are views showing circuit structures for pixel portions in active matrix type EL display panels.

In the embodiment of FIG. 20A, the current supply line 3806 is common to the two pixels. Specifically, this embodiment is characterized in that two pixels are lineal-symmetrically formed with the current supply line 3806 being the center between them. Since the number of current supply lines can be reduced therein, this embodiment is advantageous in that the pixel portion can be much finer and thinner.

Figure 20B:
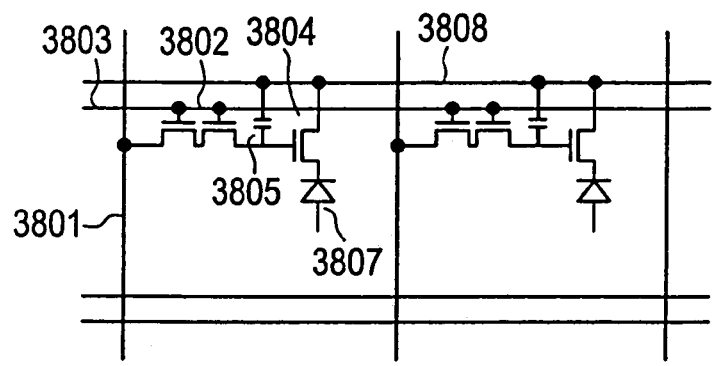

In the embodiment of FIG. 20B, the current supply line 3808 is formed in parallel to the gate wire 3803. Specifically, in this, the current supply line 3808 is so constructed that it does not overlap with the gate wire 3803, but is not limitative. Being different from the illustrated case, the two may overlap with each other via an insulating film therebetween so far as they are of different layers. Since the current supply line 3808 and the gate wire 3803 may enjoy the common exclusive area therein, this embodiment is advantageous in that the pixel pattern can be much finer and thinner.

Figure 20C:
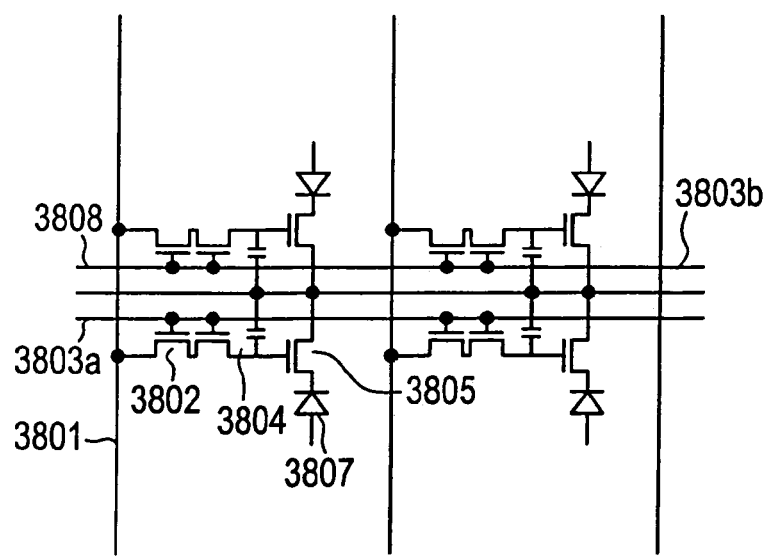

The structure of the embodiment of FIG. 20C is characterized in that the current supply line 3808 is formed in parallel to the gate wires 3803, like in FIG. 20B, and that two pixels are lineal-symmetrically formed with the current supply line 3808 being the center between them. In this, it is also effective to provide the current supply line 3808 in such a manner that it overlaps with any one of the gate wires 3803. Since the number of current supply lines can be reduced therein, this embodiment is advantageous in that the pixel pattern can be much finer and thinner.

The constitution of this Embodiment can be combined with any constitution of Embodiment 1 to 5 in any desired manner.

Embodiment 10

The embodiment of Embodiment 7 illustrated in FIG. 18A and FIG. 18B is provided with the capacitor 1704 which acts to retain the voltage applied to the gate in the current-control TFT 1703. In the embodiment, however, the capacitor 1704 may be omitted.

In the embodiment of Embodiment 7, the current-control TFT 1703 is NTFT as shown in FIG. 9C. Therefore, in the Embodiment 7, the LDD region is so formed that it overlaps with the gate electrode via the gate insulating film therebetween. In the overlapped region, formed is a parasitic capacitance generally referred to as a gate capacitance. The embodiment of this Embodiment is characterized in that the parasitic capacitance is positively utilized in place of the capacitor 1704.

The parasitic capacitance in question varies, depending on the area in which the gate electrode overlaps with the LDD region, and is therefore determined according to the length of the LDD region in the overlapped area.

Also in the embodiments of Embodiment 9 illustrated in FIG. 20A, FIG. 20B and FIG. 20C, the capacitor 3805 can be omitted.

The constitution of this Embodiment can be combined with any constitution of Embodiment 1 to 5 in any desired manner.

Embodiment 11

In addition to nematic liquid crystals, it is possible to use many kinds of liquid crystals for the electro-optical devices of the present invention, specifically the liquid crystal display devices of the present invention. For example, it is possible to use the liquid crystals published in any of the following papers: H. Furue et al, "Characteristics and Driving Scheme of Polymer-Stabilized Monostable FLCD Exhibiting Fast Response Time and High Contrast Ratio with Gray-Scale Capability", SID, 1998; T. Yoshida, T. et al, "A Full-Color Thresholdless Antiferroelectric LCD Exhibiting Wide Viewing Angle with Fast Response Time", SID DIGEST, 841, 1997; S. Inui et al, "Thresholdless Antiferroelectricity in Liquid Crystals and its Application to Displays", J. Mater. Chem., 6(4), 1996, p. 671-673; and in U.S. Pat. No. 5,594, 569.

In addition, ferroelectric liquid crystals (FLCs) showing a phase transition system of an isotropic phase—cholesterol phase—chiralsumectic C phase is used, and a phase transition is caused while applying a DC voltage, from the cholesterol phase to the chiralsumectic C phase. The resulting electro-optical characteristics of the monostable FLC in which the cone edge is made to nearly conform with the rubbing direction are shown in FIG. 21.

Figure 21:
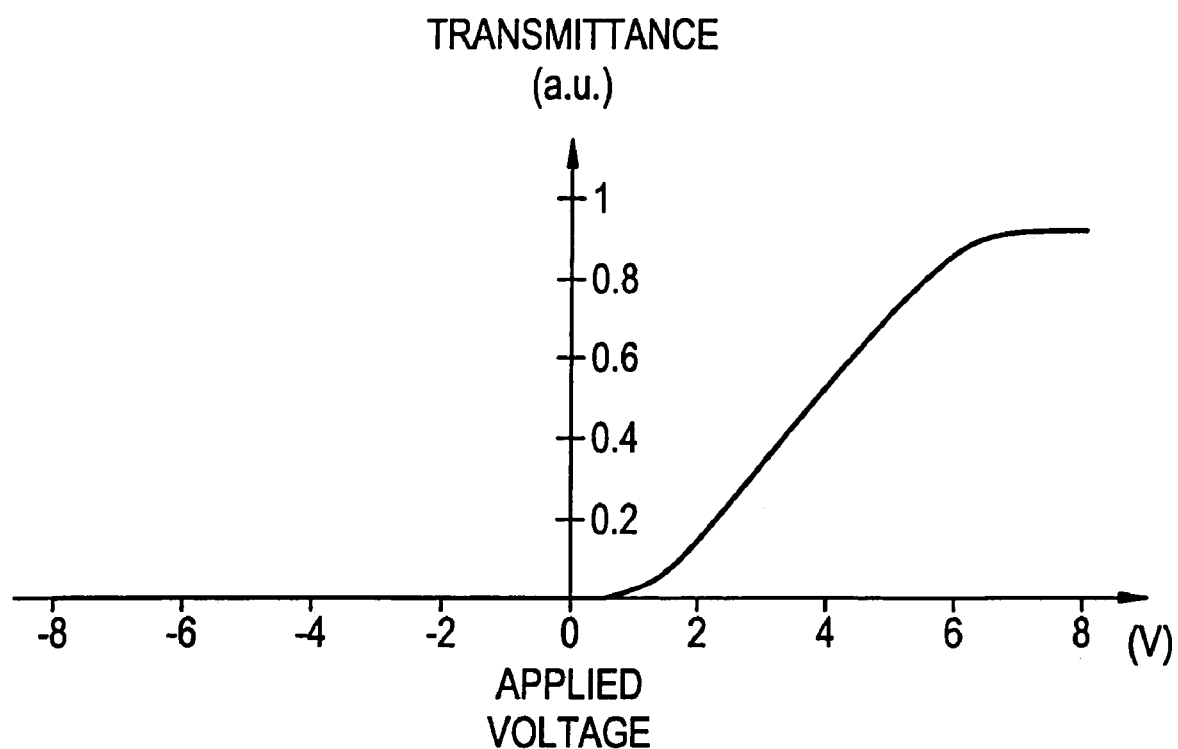
FIG. 21 is a diagram showing the electro-optical characteristics of a liquid crystal.

The display mode of the ferroelectric liquid crystal as shown in FIG. 21 is called "half-V switching mode." The vertical axis of the graph shown in FIG. 21 is the transmittance (in arbitrary units), and the horizontal axis is the applied voltage. Details regarding the "half-V switching mode" may be found in: Terada, et al, "Half-V Switching Mode FLCD", Proceedings of the 46th Applied Physics Association Lectures, Mar. 1999, p. 1316; and in Yoshihara, et al, "Time Division Full Color LCD by Ferroelectric Liquid Crystal", Liquid Crystals, vol. 3, no. 3, p. 190.

As shown in FIG. 21, it is apparent that if this type of ferroelectric mixed liquid crystal is used, it is possible to have a low voltage drive and a gradation display. A ferroelectric liquid crystal that shows these electro-optical characteristics can be used for the liquid crystal display device of the present invention.

In addition, a liquid crystal that exhibits an anti-ferroelectric phase in a certain temperature range is called an anti-ferroelectric liquid crystal (AFLC). There are mixed liquid crystals that have an anti-ferroelectric liquid crystal, which show electro-optical response characteristics in which the transmittance continuously changes in response to the electric field, and are called thresholdless antiferroelectric mixed liquid crystals. There are thresholdless antiferroelectric mixed liquid crystals that show V-type electro-optical response characteristics, and some have been shown to is have a drive voltage of approximately +/−2.5 V (when the cell thickness is between 1 and 2 μm).

Further, in general the spontaneous polarization of a thresholdless antiferroelectric mixed liquid crystal is large, and the dielectric constant of the liquid crystal itself is high. Thus, a relatively large retention capacitance is required for pixels when a thresholdless antiferroelectric mixed liquid crystal is used for a liquid crystal display device. Therefore, it is desirable to use a thresholdless antiferroelectric mixed liquid crystal that has a small spontaneous polarization.

Note that by using this type of thresholdless antiferroelectric mixed liquid crystal in the liquid crystal display devices of the present invention, a low drive voltage can be realized, so low power consumption can also be realized.

The liquid crystal described in Embodiment 11 can be employed in the liquid crystal display device having the structure of any of Embodiments 1 to 4.

Embodiment 12

The electro-optical device or semiconductor device according to the present invention can be employed as a display section or a signal processing circuit in electronic equipment. As such electronic equipment, a video camera, a digital camera, a projector, a projection television, a goggle-type display (head mount display), a navigation system for vehicles, a sound reproduction device, a note-type personal computer, game equipment, a portable information terminal (a mobile computer, a cellular phone, a handheld game unit, or an electronic book, etc.), an imaging device equipped with recording medium, and the like may be enumerated. Examples of those are shown in FIGS. 11A to 11F, 22A to 22D, and 23A to 23B.

Figure 11A:
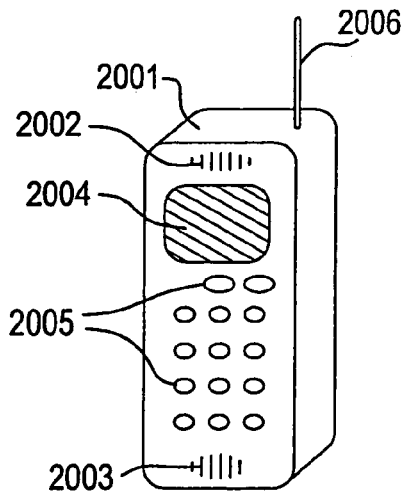
FIGS. 11A to 11F are diagrams showing examples of electronic equipment.

FIG. 11A shows a cellular telephone, comprising a main body 2001, a sound output section 2002, a sound input section 2003, a display device 2004, operation switches 2005, and an antenna 2006. The electro-optical device according to the present invention can be applied to the display device 2004, and the semiconductor circuit according to the present invention can be applied to the sound output section 2002, the sound input section 2003 or a CPU, a memory storage, and the like.

Figure 11B:
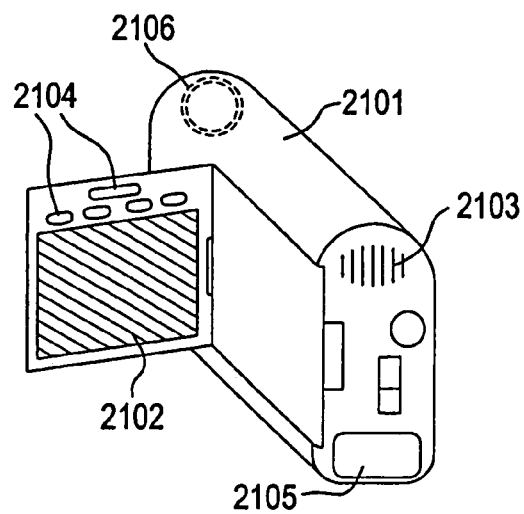

FIG. 11B shows a video camera, comprising a main body 2101, a display device 2102, a voice input unit 2103, operation switches 2104, a battery 2105, and an image receiving unit 2106. The electro-optical device according to the present invention can be applied to the display device 2102, and the semiconductor circuit according to the present invention can be applied to the voice input unit 2103 or a CPU, a memory storage, and the like.

Figure 11C:
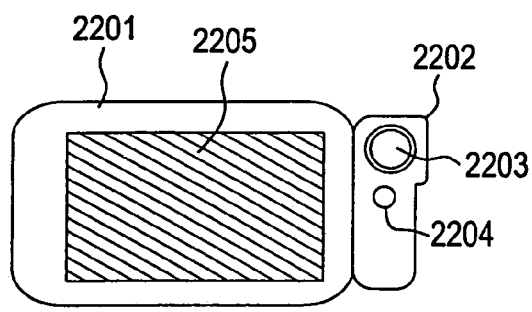

FIG. 11C shows a mobile computer, comprising a main body 2201, a camera unit 2202, an image receiving unit 2203, an operation switch 2204, and a display device 2205. The electro-optical device according to the present invention can be applied to the display device 2205, and the semiconductor circuit according to the present invention can be applied to a CPU, a memory storage, and the like.

Figure 11D:
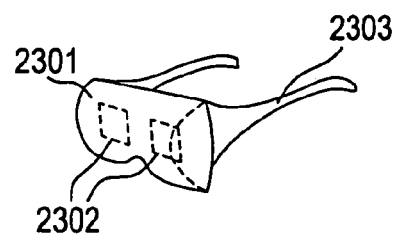

FIG. 11D shows a goggle-type display, comprising a main body 2301, a display device 2302 and an arm portion 2303. The electro-optical device according to the present invention can be applied to the display device 2302, and the semiconductor circuit according to the present invention can be applied to a CPU, a memory storage, and the like.

Figure 11E:
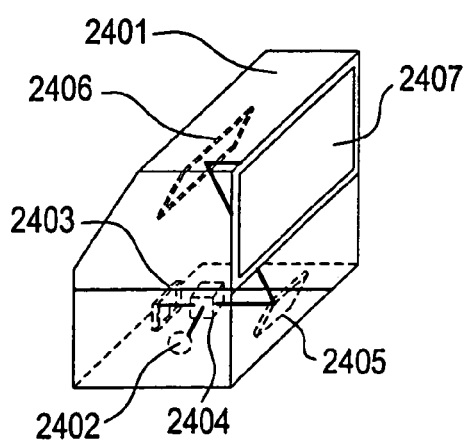

FIG. 11E shows a rear-type projector (projection television), comprising a main body 2401, a light source 2402, an electro-optical device 2403, a polarization beam splitter 2404, reflectors 2405, 2406, and a screen 2407. The electro-optical device according to the present invention can be applied to the electro-optical device 2403, and the semiconductor circuit according to the present invention can be applied to a CPU, a memory storage, and the like.

Figure 11F:
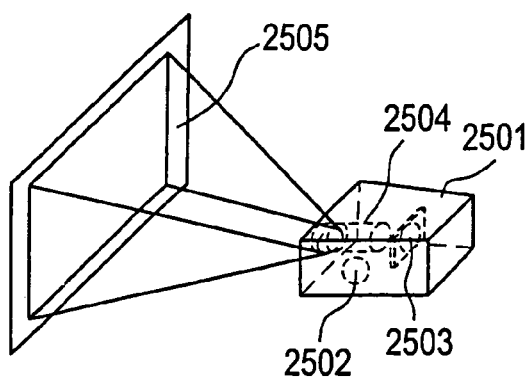

FIG. 11F shows a front-type projector, comprising a main body 2501, a light source 2502, an electro-optical device 2503, an optical system 2504, and a screen 2505. The electro-optical device according to the present invention can be applied to the electro-optical device 2503, and the semiconductor circuit according to the present invention can be applied to a CPU, a memory storage, and the like.

Figure 22A:
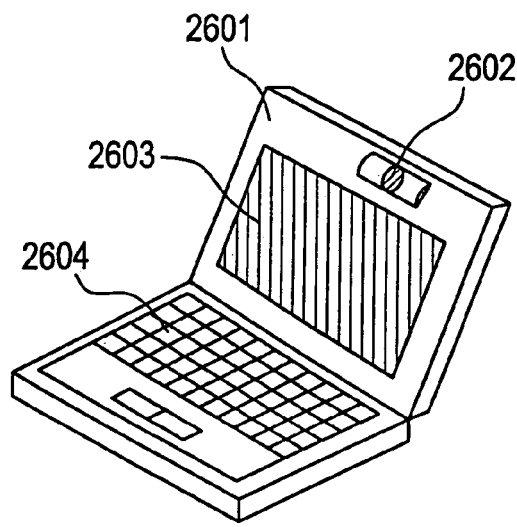
FIGS. 22A to 22D are diagrams showing examples of electronic equipment.

FIG. 22A shows a personal computer, comprising a main body 2601, an image inputting unit 2602, a display device 2603, and a key board 2604. The electro-optical device according to the present invention can be applied to the display device 2603, and the semiconductor circuit according to the present invention can be applied to a CPU, a memory storage, and the like.

Figure 22B:
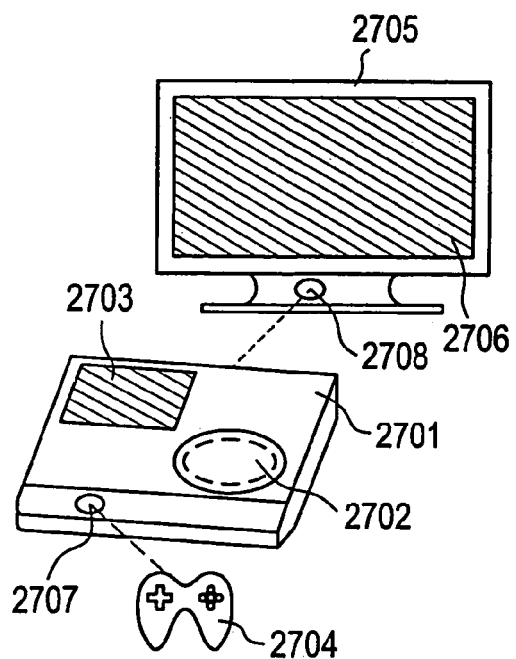

FIG. 22B shows an electronic game player (game equipment), comprising a main body 2701, a recording medium 2702, a display device 2703, and a controller 2704. The sound or picture output from the electronic game player is reproduced on a display unit including a housing 2705 and a display device 2706. A communication means between the controller 2704 and the main body 2701 or a communication means between the electronic game player and the display unit may be implemented in a wired communication, a radio communication or an optical communication. In Embodiment 8, an infrared detection is carried out by sensor units 2707, 2708. The electro-optical device according to the present invention can be applied to the display devices 2703, 2706, and the semiconductor circuit according to the present invention can be applied to a CPU, a memory storage, and the like.

Figure 22C:
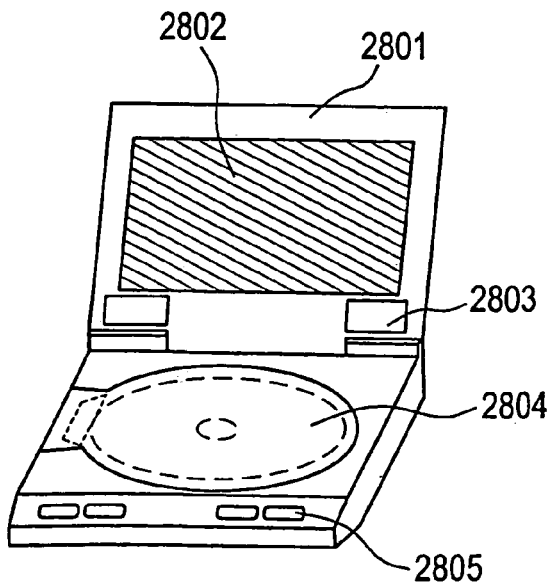

FIG. 22C shows a player (image reproduction device) that employs a recording medium in which programs are recorded (hereinafter referred to as recording medium), and comprises a main body 2801, a display device 2802, a speaker unit 2803, a recording medium 2804, and operation switches 2805. Incidentally, this image reproduction device uses as the recording medium a DVD (digital versatile disc), a CD and the like to serve as a tool for enjoying music or movies, for playing games and for connecting to the Internet. The present invention can be applied to the display device 2802, a CPU, a memory storage, and the like.

Figure 22D:
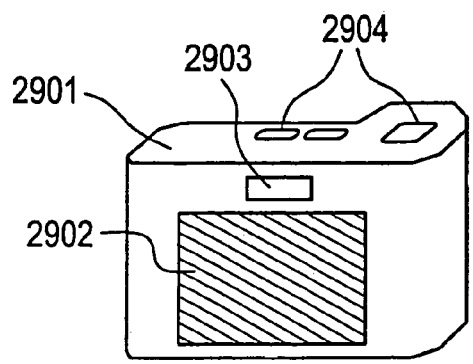

FIG. 22D shows a digital camera, comprising a main body 2901, a display device 2902, an eye piece section 2903, operation switches 2904, and an image receiving unit (not shown). The present invention can be applied to the display device 2902, a CPU, a memory storage, and the like.

Figure 23A:
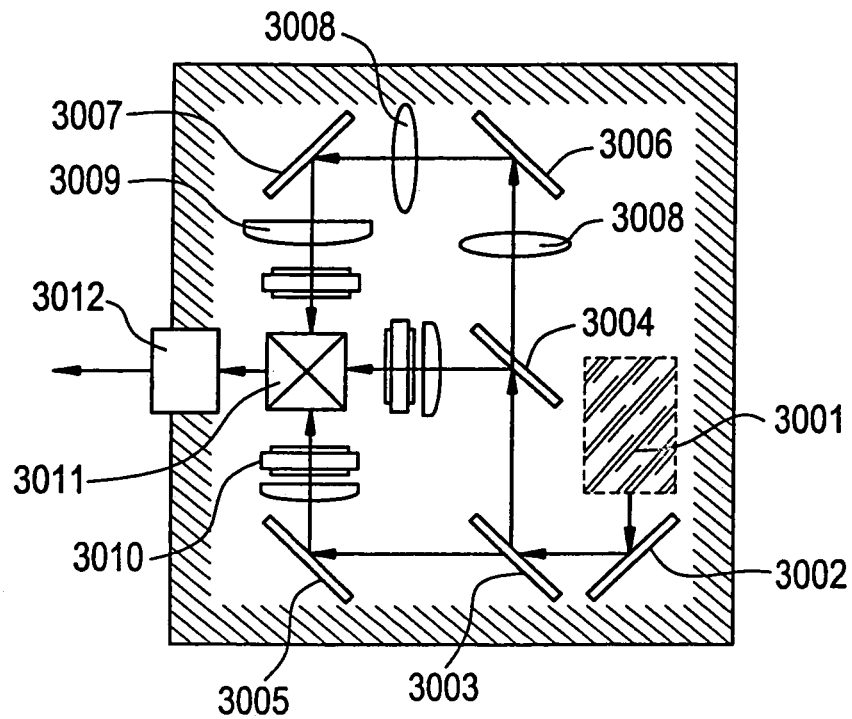
FIGS. 23A and 23B are diagrams showing the structure of an optical engine.

A description of an optical engine will be made in detail with reference to FIGS. 23A and 23B, which can be utilized in the rear-type projector shown in FIG. 11E or the front-type projector shown in FIG. 11F. FIG. 23A shows an optical engine, and FIG. 23B shows an optical light source system built in the optical engine.

The optical engine shown in FIG. 23A is composed of an optical system comprising an optical light source system 3001, mirrors 3002 and 3005 to 3007, dichroic mirrors 3003 and 3004, optical lenses 3008 and 3009, prism 3011, a liquid crystal display device 3010, and an optical projection system 3012. The optical projection system 3012 is composed of an optical system provided with a projection lens. Embodiment 8 shows an example in which the liquid crystal display device 3010 is triple stage using three lenses, but there are no special limits and a simple stage is acceptable, for example. Further, the operator may set optical systems such as optical lenses, polarizing film, film to regulate the phase difference, or IR films, etc., suitably within the optical path shown by an arrow in FIG. 23A.

Figure 23B:
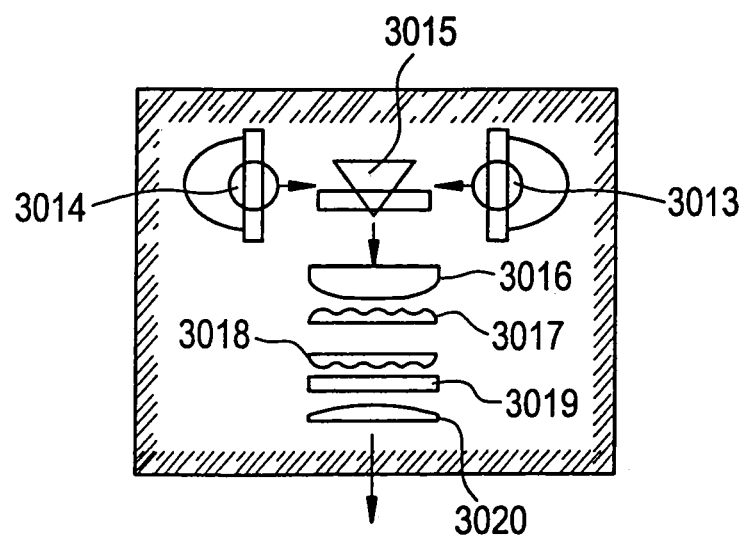

In addition, as shown in FIG. 23B, the optical light source system 3001 is composed of light sources 3013 and 3014, a compound prism 3015, collimator lenses 3016 and 3020, lens arrays 3017 and 3018, and a polarizing conversion element 3019. Note that the optical light source system shown in FIG. 23B uses two light sources, but three, four, or more light sources, may be used. Of course, a single light source is acceptable. Further, the operator may set optical lenses, polarizing film, film to regulate the phase difference, or IR films, etc., suitably in the optical system.

As described above, the scope of application of the semiconductor device of the present invention is very broad, and the present invention can be applied to electronic equipment of any field. The semiconductor device of Embodiment 12 can be realized even if the structure of any combination of Embodiments 1 to 11 is used.

It is possible to increase the reliability of an NTFT by implementing the present invention. Therefore, it is possible to ensure the reliability of an NTFT having high electrical characteristics (especially high mobility) that demand strict reliability. At the same time, by forming a CMOS circuit with an NTFT and a PTFT that have a superior balance of characteristic, a semiconductor circuit showing is high reliability and outstanding electrical characteristics can be formed.

In addition, the lengths of the second impurity region and/or the third impurity region in the present invention are optimized and made different for circuits having different drive voltages on the same substrate. Thus a circuit can be formed which has an operating speed to meet circuits that demand high operating speed, and a circuit can be formed which has voltage resistance characteristics to meet circuits that demand good voltage resistance characteristics.

Therefore, by appropriately arranging NTFTs with structures corresponding to circuit types (especially when arranged as CMOS circuits), it becomes possible to pull out circuit performance to the most extent, and a semiconductor circuit (or electro-optical device) that has high reliability and good operating performance can be realized.

Furthermore, it is possible to improve the reliability and performance of electronic equipment in which the above electro-optical devices and semiconductor circuits are loaded as parts.

What is claimed is:

1. An electronic equipment having a semiconductor device, said semiconductor device comprising:
   a semiconductor layer formed over a substrate having an insulating surface, the semiconductor layer comprising at least a first channel region, a first impurity region and a second impurity region with the first channel region therebetween, a third impurity region, a second channel region between the second and third impurity regions, a fourth impurity region between the first impurity region and the first channel region, a fifth impurity region between the first channel region and the second impurity region, a sixth impurity region between the second impurity region and the second channel region and a seventh impurity region between the second channel region and the third impurity region wherein the second impurity region is contiguous to the fifth impurity region and the sixth impurity region; and
   a first gate electrode and a second gate electrode formed over the semiconductor layer with a gate insulating film interposed therebetween wherein each of the first gate electrode and the second gate electrode has tapered portions,
   wherein the first impurity region, the second impurity region and the third impurity region contain an impurity at a first concentration,
   wherein the fourth impurity region, the fifth impurity region, the sixth impurity region and the seventh impurity region contain the impurity at a lower concentration than the first concentration,
   wherein the first gate electrode overlaps the first channel region and the second gate electrode overlaps the second channel region;
   wherein the fourth impurity region is partially overlapped with the first gate electrode;
   wherein the fifth impurity region is completely overlapped with the first gate electrode; and
   wherein the sixth impurity region is completely overlapped with the second gate electrode.

2. The electronic equipment according to claim 1, wherein said electronic equipment is selected from the group consisting of a video camera, a digital camera, a projector, a projection television, a goggle-type display, a head mount display, a navigation system for vehicles, a sound reproduction device, a note-type personal computer, game equipment, a portable information terminal, a mobile computer, a cellular phone, a handheld game unit, an electronic book, and an imaging device equipped with recording medium.

3. The electronic equipment according to claim 1 wherein the impurity is phosphorous.

4. The electronic equipment according to claim 1 wherein each of the first gate electrode and the second gate electrode comprises a first conductive layer formed on the gate insulating film and a second conductive layer formed on the first conductive layer wherein said first conductive layer extends beyond side edges of the second conductive layer.

5. The electronic equipment according to claim 1 wherein a taper angle of the tapered portions of the first and second gate electrodes is 3° or greater and 40° or less.

6. An electronic equipment having a semiconductor device, said semiconductor device comprising:
   at least a n-channel thin film transistor and a p-channel thin film transistor, each comprising:
   a semiconductor layer formed over a substrate having an insulating surface, the semiconductor layer comprising at least one channel region, source and drain regions; and
   a gate electrode formed over the semiconductor layer with a gate insulating film interposed therebetween, said gate electrode comprising a first conductive layer formed on the gate insulating film and a second conductive layer formed on the first conductive layer wherein said first conductive layer extends beyond side edges of the second conductive layer;
   wherein the semiconductor layer of the n-channel thin film transistor includes at least one impurity region located between one of source and drain regions and the channel region;
   wherein at least a portion of the impurity region is overlapped with the extending portion of the first conductive layer of the n-channel thin film transistor,
   wherein the overlapped extending portion of the first conductive layer has a thinner thickness than a portion of the first conductive layer above the channel region,
   wherein the second conductive layer does not overlap with the impurity region, and wherein the gate electrode of the n-channel thin film transistor has tapered side surfaces while the gate electrode of the p-channel thin film transistor has no tapered side surface.

7. The electronic equipment according to claim 6, wherein said electronic equipment is selected from the group consisting of a video camera, a digital camera, a projector, a projection television, a goggle-type display, a head mount display, a navigation system for vehicles, a sound reproduction device, a note-type personal computer, game equipment, a portable information terminal, a mobile computer, a cellular phone, a handheld game unit, an electronic book, and an imaging device equipped with recording medium.

8. The electronic equipment according to claim 6 wherein said first conductive layer comprises a material selected from the group consisting of Ta, Ti, Mo, Cr, Nb, Si and W.

9. The electronic equipment according to claim 6 wherein said n-channel thin film transistor and said p-channel thin film transistor are connected to each other complementarily.

10. A semiconductor device comprising:
a semiconductor layer formed over a substrate having an insulating surface, the semiconductor layer comprising at least a first channel region, a first impurity region and a second impurity region with the first channel region therebetween, a third impurity region, a second channel region between the second and third impurity regions, a fourth impurity region between the first impurity region and the first channel region, a fifth impurity region between the first channel region and the second impurity region, a sixth impurity region between the second impurity region and the second channel region and a seventh impurity region between the second channel region and the third impurity region wherein the second impurity region is contiguous to the fifth impurity region and the sixth impurity region; and
a first gate electrode and a second gate electrode formed over the semiconductor layer with a gate insulating film interposed therebetween wherein each of the first gate electrode and the second gate electrode has tapered portions; and
a pixel electrode electrically connected to the first impurity region,
wherein the first impurity region, the second impurity region and the third impurity region contain an impurity at a first concentration,
wherein the fourth impurity region, the fifth impurity region, the sixth impurity region and the seventh impurity region contain the impurity at a lower concentration than the first concentration,
wherein the first gate electrode overlaps the first channel region and the second gate electrode overlaps the second channel region;
wherein the fourth impurity region is partially overlapped with the first gate electrode;
wherein the fifth impurity region is completely overlapped with the first gate electrode; and
wherein the sixth impurity region is completely overlapped with the second gate electrode.

11. The semiconductor device according to claim 10 wherein each of the first gate electrode and the second gate electrode comprises a first conductive layer formed on the gate insulating film and a second conductive layer formed on the first conductive layer wherein said first conductive layer extends beyond side edges of the second conductive layer.

12. The semiconductor device according to claim 10 wherein a taper angle of the tapered portions of the first and second gate electrodes is 3° or greater and 40° or less.

13. The semiconductor device according to claim 10 wherein the impurity is phosphorous.

* * * * *